(12) United States Patent
Tsai et al.

(10) Patent No.: US 12,300,703 B2
(45) Date of Patent: May 13, 2025

(54) ELECTRONIC DEVICE AND DISPLAY PANEL

(71) Applicant: InnoLux Corporation, Miao-Li County (TW)

(72) Inventors: Meng-Chang Tsai, Miao-Li County (TW); Li-Jin Wang, Miao-Li County (TW); Chan-Feng Chiu, Miao-Li County (TW); Hsiao-Lan Su, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/628,847

(22) Filed: Apr. 8, 2024

(65) Prior Publication Data

US 2024/0371890 A1  Nov. 7, 2024

Related U.S. Application Data

(60) Provisional application No. 63/464,199, filed on May 5, 2023.

(30) Foreign Application Priority Data

Jan. 16, 2024 (CN) .......................... 202410060595.3

(51) Int. Cl.
 *G09G 3/20* (2006.01)
 *H01L 27/12* (2006.01)

(52) U.S. Cl.
 CPC ............. *H01L 27/124* (2013.01); *G09G 3/20* (2013.01); *G09G 2300/0426* (2013.01); *G09G 2300/0452* (2013.01); *G09G 2320/0233* (2013.01); *G09G 2370/00* (2013.01)

(58) Field of Classification Search
 CPC  H01L 27/124; G09G 3/20; G09G 2300/0426; G09G 2300/0452; G09G 2320/0233; G09G 2370/00
 See application file for complete search history.

(56) References Cited

U.S. PATENT DOCUMENTS

| | | | |
|---|---|---|---|
| 10,109,245 B2 | 10/2018 | Zeng | |
| 2018/0061314 A1* | 3/2018 | Kim | G09G 3/3233 |
| 2018/0061338 A1* | 3/2018 | Lee | G09G 3/3648 |
| 2018/0061341 A1* | 3/2018 | Kang | G09G 3/3685 |

(Continued)

FOREIGN PATENT DOCUMENTS

| | | |
|---|---|---|
| CN | 110456585 | 9/2022 |
| EP | 4016177 | 6/2022 |

*Primary Examiner* — Sejoon Ahn
(74) *Attorney, Agent, or Firm* — Winston Hsu

(57) ABSTRACT

The present disclosure provides an electronic device, which includes a substrate, a first data line arranged on the substrate and extending along a first direction, a first electrode and a second electrode arranged on the substrate and arranged along the first direction, and a third electrode and a fourth electrode arranged on the substrate and arranged along the first direction, the first electrode, the second electrode, the third electrode and the fourth electrode are electrically connected with the first data line, and the first electrode and the second electrode are located on a first side of the first data line, and the third electrode and the fourth electrode are located on a second side of the first data line relative to the first side.

16 Claims, 20 Drawing Sheets

(56) References Cited

U.S. PATENT DOCUMENTS

2018/0061357 A1\* 3/2018 Lee ..................... G09G 3/3688
2018/0061728 A1\* 3/2018 Chen .................... H10K 50/844
2018/0061900 A1\* 3/2018 Hiraga ................. H10K 50/841

\* cited by examiner

ELECTRONIC DEVICE AND DISPLAY PANEL

CROSS REFERENCE TO RELATED APPLICATION

This application claims the benefit of U.S. Provisional Application No. 63/464,199, filed on May 5, 2023. The content of the application is incorporated herein by reference.

BACKGROUND OF THE DISCLOSURE

1. Field of the Disclosure

The present disclosure relates to the photoelectric field, in particular to an electronic device with display function, which has improved arrangement and electrical connection of sub-pixels and better display function.

2. Description of the Prior Art

Electronic devices, such as display devices, are widely used, but with the increase of size or resolution, the brightness of display devices is prone to uneven phenomenon, or defects such as straight lines and/or shaking lines may occur, which affect the display quality, and the quality of electronic devices is reduced. Therefore, it is necessary to reduce the above problems.

SUMMARY OF THE DISCLOSURE

The present disclosure provides an electronic device, which is characterized by comprising a substrate, a first signal line arranged on the substrate and extending along a first direction, a first electrode and a second electrode arranged on the substrate and arranged along the first direction, and a third electrode and a fourth electrode arranged on the substrate and arranged along the first direction. The first electrode, the second electrode, the third electrode and the fourth electrode are electrically connected with the first signal line, and the first electrode and the second electrode are located on the first side of the first signal line, and the third electrode and the fourth electrode are located on the second side of the first signal line relative to the first side.

The present disclosure provides a display panel, which is characterized by comprising a substrate, a first signal line arranged on the substrate and extending along a first direction, a first electrode and a second electrode arranged on the substrate and arranged along the first direction, and a third electrode and a fourth electrode arranged on the substrate and arranged along the first direction. The first electrode, the second electrode, the third electrode and the fourth electrode are electrically connected with the first signal line, and the first electrode and the second electrode are located on the first side of the first signal line, and the third electrode and the fourth electrode are located on the second side of the first signal line relative to the first side.

The feature of the present disclosure is to provide an electronic device or a display panel, such as an electronic device with a display function and a display region. A plurality of sub-pixels are arranged in the display region, and the electrodes in the sub-pixels are electrically connected with the signal lines and the scanning lines. By designing the arrangement of the sub-pixels and the electrical connection of the electrodes in the sub-pixels with the signal lines and the scanning lines, the polarity and brightness of each sub-pixel are evenly distributed in the signal updating process of the display device, so that the possibility that users feel vertical bright lines and shake lines when watching a picture can be reduced, and the quality of products can be improved.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

In order to make the following easier to understand, readers can refer to the drawings and their detailed descriptions at the same time when reading the present disclosure. Through the specific embodiments in the present specification and referring to the corresponding drawings, the specific embodiments of the present disclosure will be explained in detail, and the working principle of the specific embodiments of the present disclosure will be expounded. In addition, for the sake of clarity, the features in the drawings may not be drawn to the actual scale, so the dimensions of some features in some drawings may be deliberately enlarged or reduced.

FIG. 2B shows a partial top view of the display device according to the first embodiment of the present disclosure, which emphasizes the high and low voltage and the positive and negative signals of the red sub-pixel after the electronic low color shift mode is turned on.

FIG. 2C shows a partial top view of the display device according to the first embodiment of the present disclosure, which shows the signal update sequence of each sub-pixel after the dual line gate mode is turned on.

FIG. 3B shows a partial top view of the display device according to the second embodiment of the present disclosure, which emphasizes the high and low voltage and the positive and negative signals of the red sub-pixel after the electronic low color shift mode is turned on.

FIG. 3C shows a partial top view of the display device according to the second embodiment of the present disclosure, which shows the signal update sequence of each sub-pixel after the dual line gate mode is turned on.

FIG. 4B shows a partial top view of the display device according to the third embodiment of the present disclosure, which emphasizes the high and low voltage and the positive and negative signals of the red sub-pixel after the electronic low color shift mode is turned on.

FIG. 4C is a partial top view of the display device according to the third embodiment of the present disclosure, which shows the signal update sequence of each sub-pixel after the dual line gate mode is turned on.

FIG. 5B shows a partial top view of the display device according to the fourth embodiment of the present disclosure, which emphasizes the high and low voltage and the positive and negative signals of the red sub-pixel after the electronic low color shift mode is turned on.

FIG. 5C shows a partial top view of the display device according to the fourth embodiment of the present disclosure, which shows the signal update sequence of each sub-pixel after the dual line gate mode is turned on.

FIG. 6B shows a partial top view of the display device according to the fifth embodiment of the present disclosure, which emphasizes the high and low voltage and the positive and negative signals of the red sub-pixel after the electronic low color shift mode is turned on.

FIG. 6C is a partial top view of the display device according to the fifth embodiment of the present disclosure, which shows the signal update sequence of each sub-pixel after the dual line gate mode is turned on.

FIG. 7B shows a partial top view of the display device according to the sixth embodiment of the present disclosure, which emphasizes the high and low voltage and the positive and negative signals of the red sub-pixel after the electronic low color shift mode is turned on.

FIG. 7C shows a partial top view of the display device according to the fifth embodiment of the present disclosure, which shows the signal update sequence of each sub-pixel after the dual line gate mode is turned on.

DETAILED DESCRIPTION

Figure 1A:
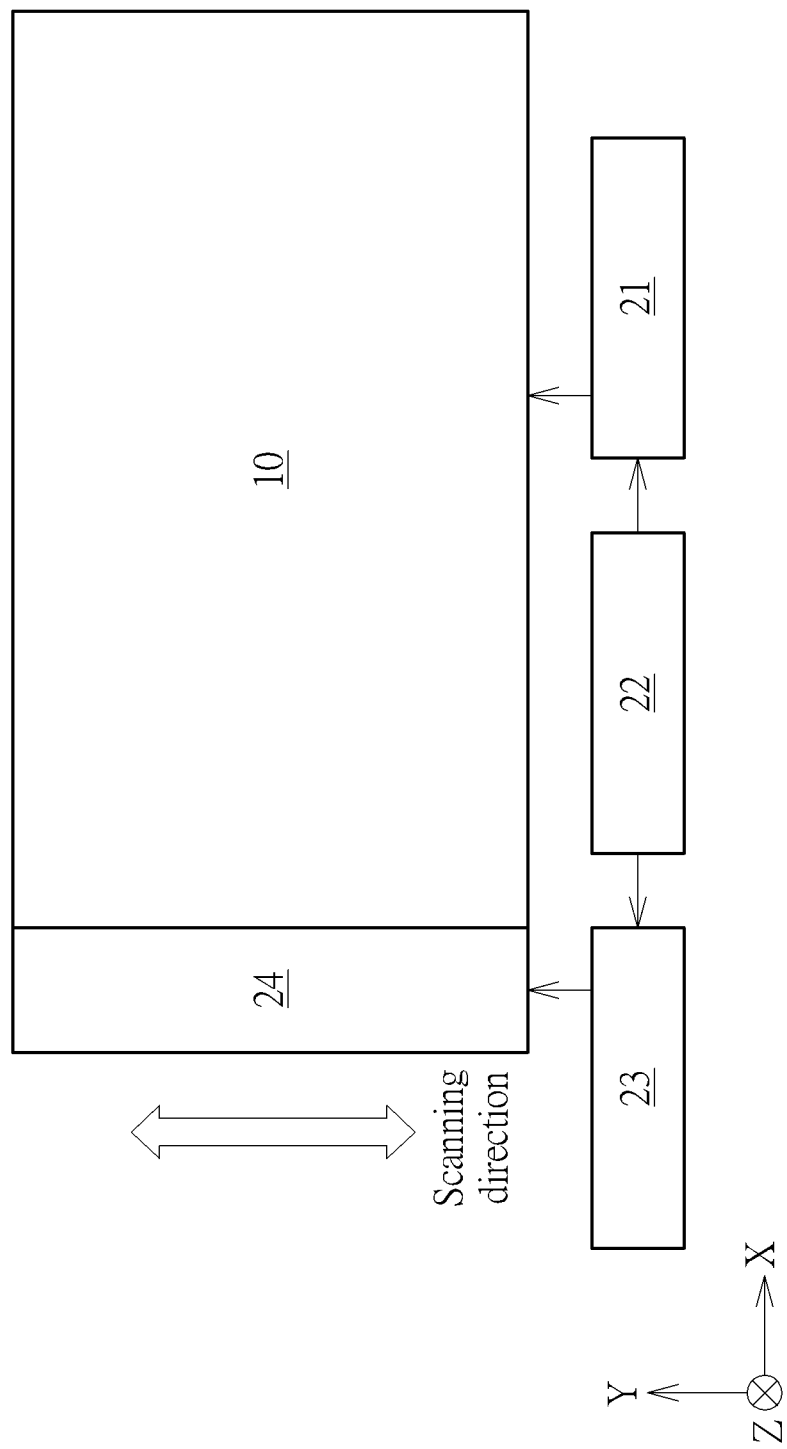
FIG. 1A is a schematic plan view showing the arrangement of the display region and surrounding circuits of an electronic device.

The present disclosure may be understood by reference to the following detailed description, taken in conjunction with the drawings as described below. It is noted that, for purposes of illustrative clarity and being easily understood by the readers, various drawings of this disclosure show a portion of an electronic device (i.e. a display device in this disclosure), and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It will be understood that when an element or layer is referred to as being "(electrically) connected to" another element or layer, it can be directly (electrically) connected to the other element or layer, or intervening elements or layers may be presented. In contrast, when an element is referred to as being "directly (electrically) connected to" another element or layer, there are no intervening elements or layers presented. In contrast, when an element is referred to as being "disposed on" or "formed on" A element, it may be directly disposed on (or formed on) A element, or may be indirectly disposed on (or formed on) A element through other component. In contrast, when an element is referred to as being"disposed between" A element and B element, it may be directly disposed between A element and B element, or may be indirectly disposed between A element and B element through other component.

The terms "about", "substantially", "equal", or "same" generally mean within 20% of a given value or range, or mean within 10%, 5%, 3%, 2%, 1%, or 0.5% of a given value or range.

In addition, the phrase "in a range from a first value to a second value" indicates the range includes the first value, the second value, and other values in between.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The electronic device of the present disclosure may include, but is not limited to, a display device, an antenna device, a sensing device, a light emitting device, or a splicing device. The electronic device may include a bendable or flexible electronic device. The electronic device may include an electronic unit. The electronic device includes, for example, a liquid crystal layer or a light emitting diode (LED). An electronic unit may include passive components and active components, such as, but not limited to, capacitors, resistors, inductors, electrodes, liquid crystal cell, variable capacitors, filters, diodes, transistors, sensors, microelectromechanical system components (MEMS), liquid crystal chip, controller, etc. Diodes can include light emitting diodes or photodiodes. The light emitting diode may include, for example, organic light emitting diode (OLED), submillimeter light emitting diode (mini LED), micro light emitting diode (micro LED), quantum dot light emitting diode (quantum dot LED), fluorescence, phosphor or other suitable materials, or combinations thereof, but is not limited thereto. The sensor may include, for example, a capacitive sensors, an optical sensors, an electromagnetic sensors, a fingerprint sensor (FPS), a touch sensor, an antenna, or a pen sensor, but is not limited thereto. The controller may include, for example, a timing controller and the like, but is not limited thereto. Hereinafter, the display device will be used as an electronic device to explain the present disclosure, but the present disclosure is not limited to this.

It should be understood that the embodiments listed below can replace, recombine and mix the technical features of several different embodiments to complete other embodiments without departing from the spirit or conflict of this disclosure.

FIG. 1A is a schematic plan view showing the arrangement of the display region and surrounding circuits of an electronic device. As shown in FIG. 1A, an electronic device, such as a display device, has a display region 10 and a peripheral region. The peripheral region may include a plurality of peripheral circuits and a gate driver circuit 24, wherein the display region 10 is a region for emitting light and providing pictures for users to watch. The display region 10 contains a plurality of sub-pixels, each sub-pixel has at least one switching element (such as a transistor, not shown), and a plurality of signal lines (not shown) and scanning lines (not shown) are electrically connected with the switching elements in these sub-pixels. Signal lines and scanning lines are usually arranged perpendicular to each other, for example, a plurality of signal lines are parallel to each other and arranged in the Y direction, while a plurality of scanning lines are parallel to each other and arranged in the X direction, but this disclosure is not limited to this.

In order to control these switching elements to display different pictures, the signal lines and scanning lines in the display region 10 are electrically connected to the peripheral circuits. The peripheral circuit can control the display screen of the display region 10 by a plurality of different integrated circuits (IC) as required. In this embodiment, the peripheral circuit includes a plurality of integrated circuits (ICs), including a signal driver IC 21, a time controller IC 22 and a level shift IC 23. The gate driving circuit 24 may be, for example, a gate on array (GOA) formed by a semiconductor process, or an integrated circuit directly connected to a conductive line on the substrate, or a chip on film (COF) with an integrated circuit electrically connected to a conductive line on the substrate, and the present disclosure is not limited to this. Among them, the function of the signal driving IC 21 is to transmit data signals to the signal lines in the display region 10, the function of the time control IC 22 is to control the timing and the algorithm of processing electronic devices, the gate driving circuit 24 is electrically connected with the scanning lines to transmit scanning signals to scan the display region 10 in sequence, and the function of the level shift IC 23 is to control the turning on and turning off of the scanning lines. It can be understood that the above-mentioned display region 10 and integrated circuits belong to the conventional technology in this field, and this embodiment only presents one example. In this disclosure, some integrated circuits may be added or reduced, which may also achieve the effect of displaying images on electronic devices, and such variations are within the scope of this disclosure.

In various embodiments of the present disclosure, the display device changes the order of data signals and scanning signals of each sub-pixel in the display region by adjusting the configuration of sub-pixels electrically connected with signal lines and scanning lines, so as to achieve the purpose of reducing vertical bright lines and improve the display quality. Details are described in the following paragraphs.

Figure 1B:
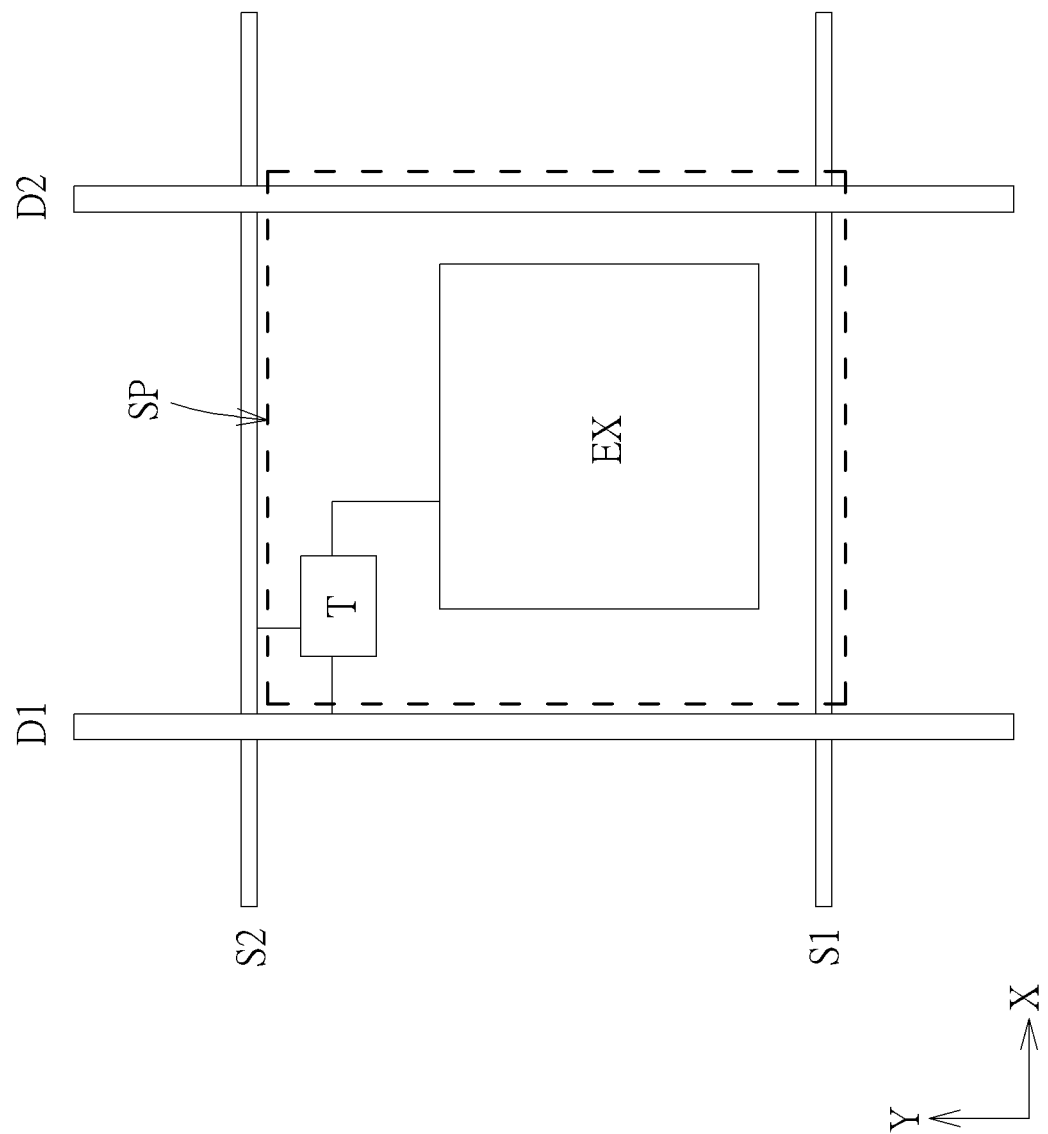
FIG. 1B is an enlarged partial top view of the display region.

FIG. 1B shows an enlarged partial top view of the display region, especially about the electrical connection relationship among sub-pixels, switching elements and electrodes. In the display region shown in FIG. 1A, a substrate structure is formed by arranging a plurality of scanning lines, a plurality of signal lines and a plurality of electrodes on the substrate, wherein the scanning lines are arranged in parallel with each other along one direction and connected to the gate driving circuit 24, and the signal lines are arranged in parallel with each other along the other direction and connected to the signal driving integrated circuit 21. Taking FIG. 1B as an example, it is shown that the signal line D1 and the signal line D2 extend along the Y direction and are arranged in parallel along the X direction, and the scanning line S1 and the scanning line S2 extend along the X direction and are arranged in parallel along the Y direction. The range between two adjacent signal lines D1 and D2 and two adjacent scanning lines S1 and S2 is defined as a sub-pixel SP, for example, from the lower side of scanning line S1 to the lower side of scanning line S2, and from the right side of signal line D1 to the right side of signal line D2, but it is not limited to this. Each sub-pixel SP includes an electrode EX and at least one switching element T, and the switching element T electrically connects one of the adjacent signal lines (for example, the signal line D1) and one of the scanning lines (for example, the scanning line S2). In the display device, a light-emitting element (not shown) may be further included to be electrically connected with the electrode EX. In other electronic devices, an electronic unit (such as a controller) may be further included to be electrically connected with the electrode EX. The following paragraphs will further describe the relationship between the sub-pixel SP and the electrode EX.

Figure 2A:
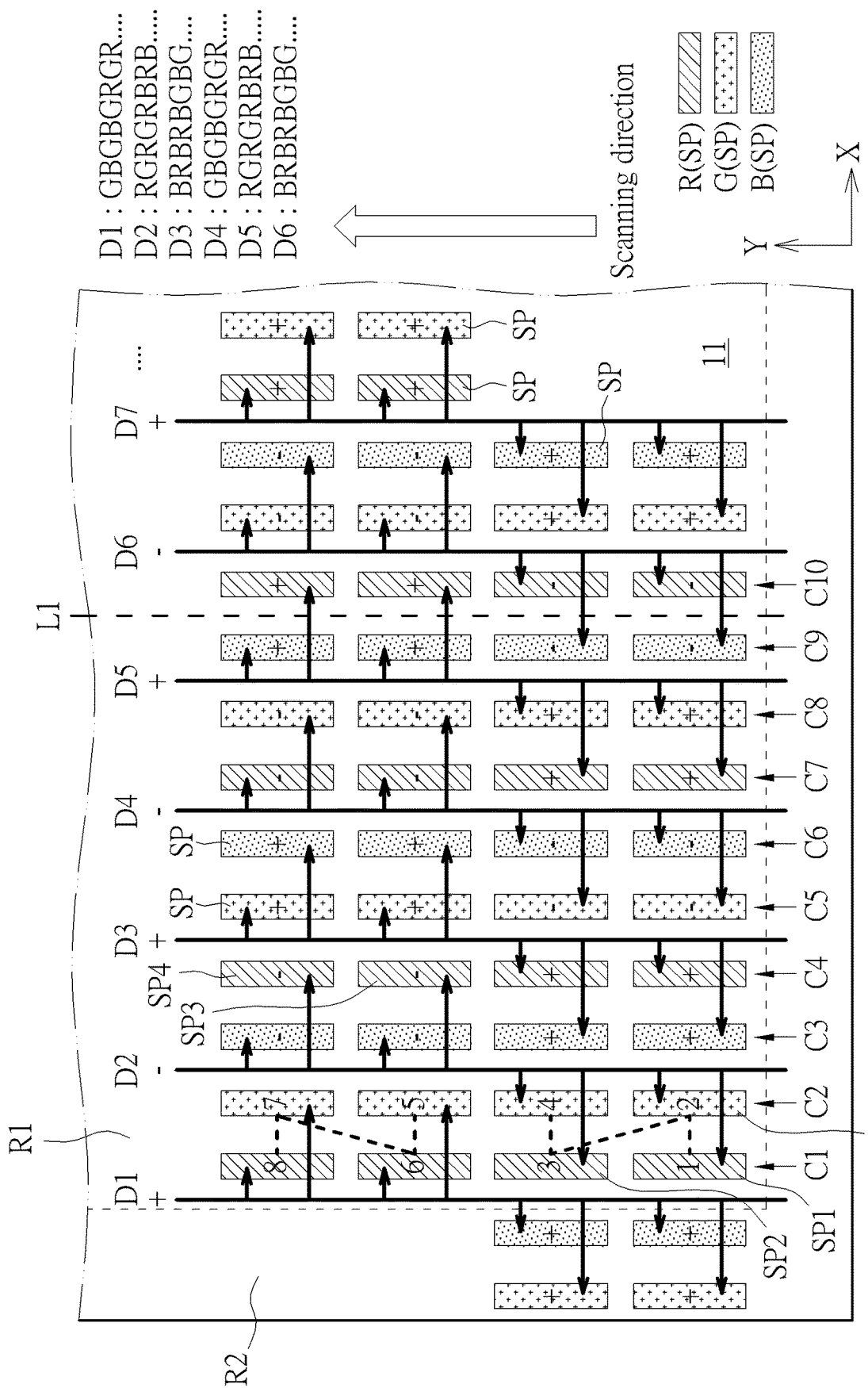
FIG. 2A shows a partial top view of the display device according to the first embodiment of the present disclosure, showing the signal update sequence of each sub-pixel.

FIG. 2A shows a display device according to a first embodiment of the present disclosure, showing a partial top view of each sub-pixel configuration. It is worth noting that starting from this embodiment, only a part of the display region is drawn in order to show the features of the present disclosure concisely and clearly, while most of the areas not drawn in the rest of the display region have the same or similar structures as those drawn in the figure, so they are not repeated here.

As shown in FIG. 2A, the display device includes a substrate 11, and the substrate 11 defines a display region R1 and a peripheral region R2. In FIG. 2A, a plurality of signal lines are arranged on the substrate 11, and the signal lines are arranged along the vertical direction (Y direction). Taking FIG. 2A as an example, it includes a plurality of signal lines such as signal line D1, signal line D2, signal line D3, signal line D4, signal line D5, signal line D6 and signal line D7, but in fact, the display region R1 usually includes more signal lines, which are not drawn for the sake of simplicity. The signal lines D1-D7 are electrically connected to the signal driving integrated circuit 21 (refer to FIG. 1A), but for the sake of simplicity, the position of the signal driving integrated circuit is not shown in FIG. 2A, and the signal driving integrated circuit can be located at any suitable position on the substrate 11, so the present disclosure is not limited to this. For example, the signal driving integrated circuit may be located below the display region R1 in FIG. 2A to provide signals to the signal lines.

In addition, FIG. 2A also includes a plurality of scanning lines (not shown). In FIG. 2A, the scanning lines may extend along the horizontal direction (X direction), but the actual arrangement can be adjusted as required, and this disclosure does not limit the specific electrical connection mode of the scanning lines.

In this embodiment, a plurality of sub-pixels SP are arranged in an array in the display region R1. The sub-pixel SP described here is located between the adjacent signal line (arranged along the X direction) and the adjacent scanning line (arranged along the Y direction). More specifically, in this embodiment, because signal lines are arranged at intervals, that is to say, two adjacent signal lines include two sub-pixels SP when viewed along the X direction. Therefore, first, a reference line L1 is defined between two adjacent signal lines (such as between the signal line D5 and the signal line D6), which are equidistant from the signal line D5 and the signal line D6 respectively in the X direction, and then a sub-pixel SP is a range surrounded by a signal line (such as the signal line D5), the reference line L1 and two adjacent scanning lines.

Please refer to FIG. 1B and FIG. 2A together. Each sub-pixel SP described here includes an electrode EX and at least one switching element T (refer to FIG. 1). At least one switching element T is electrically connected with the electrode EX, the signal line and the scanning line. In this embodiment, the sub-pixel SP may further include a light emitting element capable of emitting light of a single color, and the light emitting element is electrically connected with the electrode EX. In other embodiments, the sub-pixel SP can further include other electronic components and be electrically connected with the electrode EX, and can be controlled and driven by scanning lines and signal lines. The following paragraphs take the display device as an example, and the sub-pixel SP is collectively referred to as a light-emitting unit including electrodes, switching elements and light-emitting elements. The sub-pixels SP are divided into red sub-pixels (R), blue sub-pixels (B) and green sub-pixels (G), in which a red sub-pixel R, a blue sub-pixel B and a green sub-pixel G can be combined into a pixel. In FIG. 2A, the sub-pixels located in the display region R1 are arranged in an array, and are repeatedly arranged according to different colors, for example, in the order of red sub-pixel R, green sub-pixel G, blue sub-pixel B, red sub-pixel R, green sub-pixel G, blue sub-pixel B . . . in the X direction from left to right. The peripheral region R2 is a region where no light is emitted, and it contains peripheral circuits and/or various integrated circuits. In addition, in FIG. 2A, some sub-pixels SP are located in the peripheral region R2, which means that these sub-pixels SP will not be seen by users, and these sub-pixels SP can be regarded as dummy sub-pixels. In addition, in FIG. 2A, sub-pixels emitting different colors (red sub-pixel R, green sub-pixel G and blue sub-pixel B) are represented by different shading pattern. Although not all sub-pixels SP are marked with symbols in FIG. 2A for the sake of simplicity, each sub-pixel is marked with a corresponding shading pattern in FIG. 2A, and it can be judged that it is one of red sub-pixels, green sub-pixels or blue sub-pixels by its shading pattern.

In FIG. 2A, signal lines D1-D7 and other not shown signal lines can transmit polarity signals to each sub-pixel SP. The polarity signals in this disclosure include positive signals and negative signals. In FIG. 2A and other subsequent embodiments, the symbol "+" represents the positive signals and the symbol "−" represents the negative signals. In addition, in order to clearly indicate whether the signal transmitted by the signal line is positive or negative, the symbol "+" and the symbol "-" are marked beside the signal lines D1-D7 in FIG. 2A.

As described above (refer to FIGS. 1B and 2A), the switching element T in the sub-pixel SP is electrically connected to the signal line and the scanning line, and at the same time, the switching element T is electrically connected to the electrode EX. When the signal of the scanning line turns on the switching element T, the signal on the signal line will be written into the electrode EX through the switching element T, and the signal restored in the electrode EX will be updated, which means that the sub-pixel SP is updated. That is, if it is mentioned in the following paragraph that "the signal of the sub-pixel is updated", which means the signal of the electrode EX included in the sub-pixel SP is updated. In FIG. 2A, in order to clearly show the electrical connection relationship between signal lines and sub-pixels, the signal lines D1-D7 and corresponding electrically connected sub-pixels SP are indicated by lateral arrows. In other words, the positions indicated by the lateral arrows extending from the signal lines D1-D7 represent the sub-pixels SP to which the signal lines D1-D7 are electrically connected.

In addition, in FIG. 2A and subsequent embodiments, the sub-pixels SP arranged in an array are defined as the first to tenth columns (corresponding to the first column C1, the second column C2, the third column C3, the fourth column C4, the fourth column C5, the sixth column C6, the seventh column C7, the eighth column C8, the ninth column C9 and the tenth columns C10 in FIG. 2A).

For the convenience of readers' comparison, the signal lines D1-D6 in the right half of FIG. 2A correspond to the order of transmitting data signals, which can also be called data mapping diagram. Where R represents the signal of red sub-pixel, G represents the signal of green sub-pixel and B represents the signal of blue sub-pixel. In FIG. 2A, the scanning direction is sequentially scanned from bottom to top (from −Y direction to +Y direction), that is, the scanning order is from −Y direction to +Y direction, and the horizontal arrow (X direction) indicates the sub-pixel SP electrically connected by signal lines in sequence. Taking the signal line D2 as an example, the order in which the sub-pixels SP are electrically connected is the red sub-pixel (R,1) on the left side of the signal line D2 in the first column C1, the green sub-pixel (G,2) on the left side of the signal line D2 in the second column C2, the red sub-pixel (R,3) on the left side of the signal line D2 in the first column C1, the green sub-pixel (G,4) on the left side of the signal line D2 in the second column C2, the red sub-pixel R on the right side of the signal line D2 in the fourth column C4, the blue sub-pixel B on the right side of the signal line D2 in the third column C3, the red sub-pixel R on the right side of the signal line D2 in the fourth column C4, the blue sub-pixel B on the right side of the signal line D2 in the third column C3 . . . . The signal distribution diagram on the right can be simply expressed as D2: D2:RGRGRBRB . . . . Regarding other signal lines, please also refer to FIG. 2A for other electrical connection modes of the signal lines D1, D3-D6. Reference can be made to the data mapping diagram on the right of FIG. 2A, in which the sub-pixel update sequence of signal lines D1-D6 is drawn, while signal line D7 is the same as signal line D1 and begins to repeat the cycle, and the electrical connection modes of other signal lines will be analogized.

In addition, the signal update sequence in this disclosure is from bottom to top, but this signal update direction is only an example of this disclosure. In other embodiments of the present disclosure, the direction of signal update is not limited, that is, the direction of signal update may also be from top to bottom, and this variation also belongs to the scope of the present disclosure.

Furthermore, in FIG. 2A, the order in which the signals of each sub-pixel SP are updated is indicated by numbers and dashed lines. Take the eight sub-pixels SP between the signal line D1 and the signal line D2 as an example, in which the four sub-pixels SP in the lower half are electrically connected with the signal line D2 and marked as 1, 2, 3 and 4 respectively according to the signal update order. After connecting the four sub-pixels SP in the lower half according to the signal update order (indicated by the dotted line), it presents an inverted Z shape, which is called "inverted Z signal update arrangement" in the following paragraphs. On the other hand, the four sub-pixels SP in the upper half are electrically connected to the signal line D1 and labeled as 5, 6, 7 and 8 respectively according to the signal update order. After connecting the four sub-pixels SP in the upper half according to the signal update order (indicated by dotted lines), they present a "regular Z" shape, which is called "regular Z signal update arrangement" in the following paragraphs.

For the same signal line, take the signal line D2 as an example. In FIG. 2A, the signal line D2 is electrically connected to eight sub-pixels SP, of which the lower four electrically connected sub-pixels SP are located on the left side of the signal line D2, and the upper four electrically connected sub-pixels SP are located on the right side of the signal line D2. And so on for other signal lines.

It is worth noting that the numbers 1, 2, 3, 4, 5, 6, 7, 8 or symbols "+" and "−" in FIG. 2A are used to clearly indicate the signal update sequence of adjacent sub-pixels SP and the polarity of sub-pixels, but these numbers/symbols do not represent the element numbers.

Therefore, it can be observed from FIG. 2A that for any signal line D1-D7, some of the electrically connected sub-pixels SP are located on the left side of the signal line, while some of the electrically connected sub-pixels SP are located on the right side of the signal line. In addition, from the polarity (the symbol "+" stands for positive polarity and symbol "−" stands for negative polarity) of FIG. 2A, it can be found that the arrangement of sub-pixels SP with the same polarity does not appear for each sub-pixel SP in the same column (Y direction). For example, the polarity distribution of sub-pixels in the same column (Y direction) is "+ + − −" or "− − + +", and it does not appear that all sub-pixels are positive polarity or all are negative polarity. This can reduce the occurrence of vertical bright lines.

In addition, for each signal line, for two sub-pixels SP electrically connected in the same row (X direction), the horizontal arrows drawn are longer and shorter, where the longer arrow or the shorter arrow represents the distance of the sub-pixel SP from the signal line in the X direction. In this embodiment, the direction of signal update is from bottom to top, that is, for two sub-pixels SP that are adjacent in the X direction and electrically connected to the same signal line, one is far away from the signal line, so a longer arrow is drawn, and the other is close to the signal line, so a shorter arrow is drawn, wherein the sub-pixel SP whose signal is updated earlier (i.e., the sub-pixel SP whose arrow is lower) is defined as the sub-pixel SP whose signal is updated earlier, and the sub-pixel SP whose signal is updated later (i.e., the sub-pixel whose arrow is higher) is defined as the sub-pixel SP whose signal is updated later. Take the signal line D2 as an example, in which the red sub-pixel R located in the first column C1 on the left side is the earlier updated sub-pixel, and the green sub-pixel G located in the second column C2 on the left is the later updated sub-pixel.

If all the sub-pixels in the same column (Y direction) are the sub-pixels updated earlier, and the sub-pixels in the same color in another column are the sub-pixels updated later, from the user's point of view, the display screen is easy to produce vertical lines, which is also easy to produce another display defect. In more detail, taking FIG. 2A as an example, it is assumed that if a certain column of green sub-pixels G are all updated earlier, and the right and adjacent blue sub-pixels B are all updated later, the signal of the green sub-pixel G updated earlier will be coupling by the signal of the blue sub-pixel B updated later and slightly deviate from the original signal size. When another column of green sub-pixels G is updated later, the signal intensity of two columns of green sub-pixels G with different update sequences will be different, which will affect the intensity of light emitted by sub-pixels SP, and it is easy to produce vertical lines.

As can be seen from FIG. 2A, in this embodiment, all the sub-pixels SP in the same column (Y direction) are not all the sub-pixels updated first or all the sub-pixels updated later, thus reducing the probability of vertical lines on the display screen. For example, take the red sub-pixel R located in the first column C1 on the left side of the signal line D2 as an example. The lower two red sub-pixels R are the earlier updated sub-pixels (electrically connected to the signal line D2), while the upper two red sub-pixels R are the later updated sub-pixels (electrically connected to the signal line D1). Therefore, each sub-pixel SP in the same column contains both the earlier updated sub-pixel and the later updated sub-pixel. The electrical connection mode of sub-pixels, signal lines and scanning lines as shown in FIG. 2A, when the signals of each sub-pixel SP are updated in sequence, it is not easy to generate vertical lines of the display screen, and the quality of the display screen can be improved.

Figure 2B:
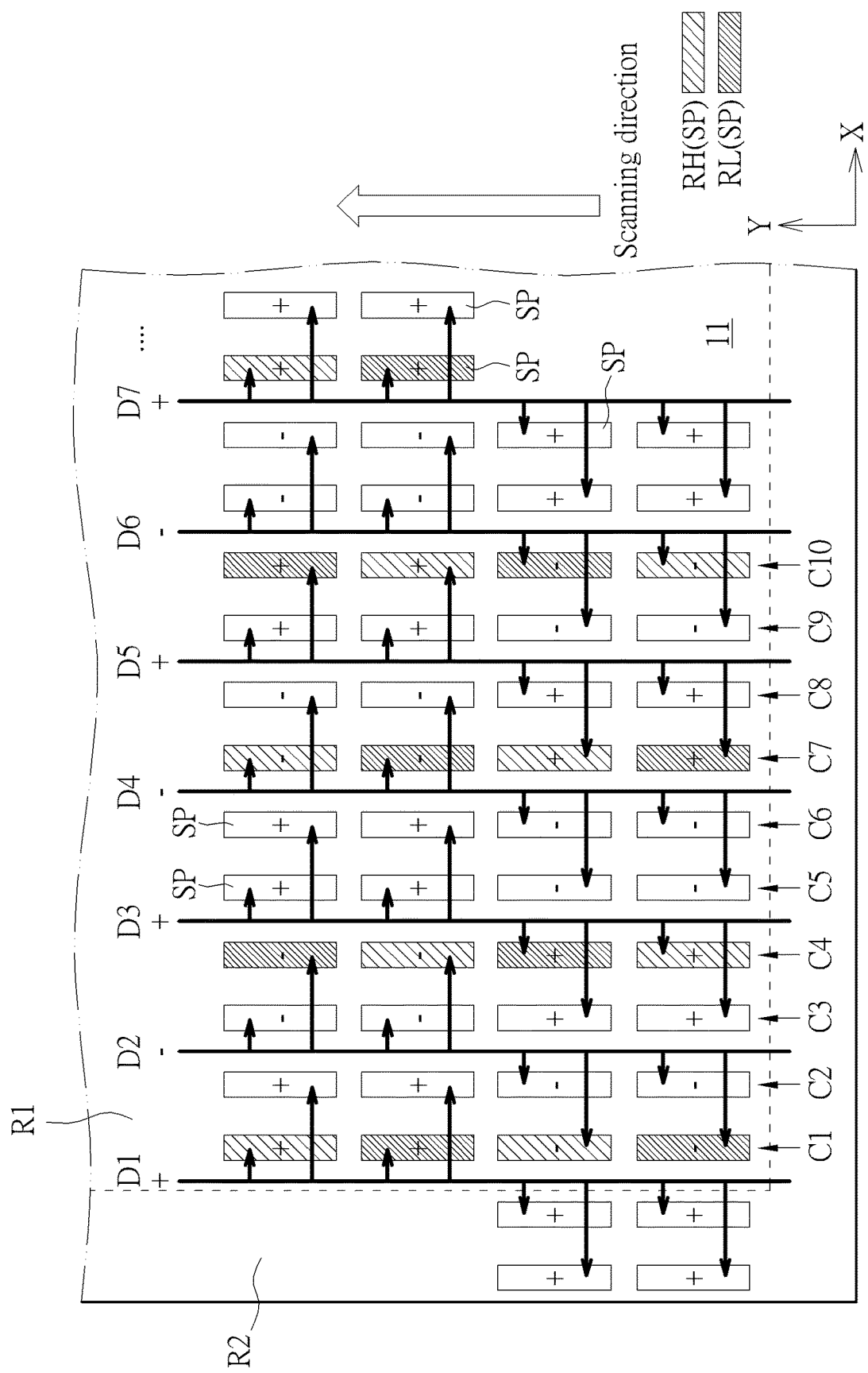

FIG. 2B shows a partial top view of the high and low voltage and positive and negative signals of the red sub-pixel after the electronic low color shift (ELCS) mode is turned on in the display device according to the first embodiment of the present disclosure. Before describing the features of FIG. 2B, the electronic low color shift (ELCS) mode of the present disclosure will be explained. The electronic low color shift mode here refers to electronically controlling the brightness of each sub-pixel SP, so that the brightness of each sub-pixel SP is staggered, so as to balance the brightness of the whole display screen, so that when users watch the display screen from different perspectives, there will be no obvious brightness change of the screen due to the change of viewing angle. Generally speaking, for the sub-pixels SP in the same row (X direction), the brightness and darkness of each sub-pixel SP can be adjusted to be bright, dark, bright, dark, (HLHL) . . . in an orderly and repeated arrangement. Or in other embodiments, bright, bright, dark, dark (HHLL), or bright, bright, bright, dark, dark, dark (HHHLLL), etc. can be arranged in sequence, and different bright and dark arrangements can be adjusted according to different use requirements, and this disclosure is not limited to this. For the sub-pixels SP in the same column (Y direction), it is better to show the distribution of bright, dark, bright, dark (HLHL) or dark, bright, dark, light (LHLH), so as to display the light and dark distribution of the sub-pixels.

In FIG. 2B, only the red sub-pixel R is discussed (refer to the position of the red sub-pixel R in FIG. 2A), and other blue sub-pixels and green sub-pixels can also be compared and analyzed, so they are not discussed here. In order to clearly show the characteristics on the figure, the blue sub-pixel and green sub-pixel are represented by a blank pattern, but it can be understood that the blue sub-pixel and green sub-pixel are not turned off and do not emit, but in fact, the blue sub-pixel and green sub-pixel may also emit light and have a light and dark distribution. In FIG. 2B, RH represents a high-brightness red sub-pixel and RL represents a low-brightness red sub-pixel, both of which are represented by different shading pattern, in which H stands for high brightness and L stands for low brightness. Viewed from the same row (X direction) or the same column (Y direction), each sub-pixel SP presents bright, dark, bright, dark (HLHL) or dark, bright, dark, bright (LHLH) distribution, so as to achieve the purpose of evenly distributing the brightness and darkness of each sub-pixel SP and improve the quality of the display screen.

As shown in FIG. 2B, the sub-pixels SP arranged in an array are also defined as the first to tenth columns (corresponding to the first column C1, the second column C2, the third column C3, the fourth column C4, the fifth column C5, the sixth column C6, the seventh column C7, the eighth column C8, the ninth column C9 and the tenth column C10 in FIG. 2B). Each sub-pixel SP includes four groups: high brightness and positive polarity H(+), low brightness and positive polarity L(+), high brightness and negative polarity H(−) and low brightness and negative polarity L(−) according to its positive and negative polarity (+ or −) and brightness and darkness (H or L). It can be found from FIG. 2B and Table 1 below that in any column of red sub-pixel R (the first column C1, the fourth column C4, the seventh column C7 and the tenth column C10), the number of sub-pixels SP in the above four polarity and brightness groups is equal. Take table 1 as an example, within the range depicted in FIG. 2B, the numbers of the sub-pixels SP with high brightness and positive polarity H(+), low brightness and positive polarity L(+), high brightness and negative polarity H(−) and low brightness and negative polarity H (−) are all 1. Similarly, in other columns, blue sub-pixels and green sub-pixels are also distributed in this way. That is to say, under the arrangement of sub-pixels shown in FIG. 2B, after the electronic low color shift mode is turned on, the polarity distribution and bright-dark distribution among sub-pixels SP still show an average distribution, thus reducing the probability of display defects such as shake head.

TABLE 1

|  | H(+) | H(−) | L(+) | L(−) |
|---|---|---|---|---|
| C1 | 1 | 1 | 1 | 1 |
| C4 | 1 | 1 | 1 | 1 |
| C7 | 1 | 1 | 1 | 1 |
| C10 | 1 | 1 | 1 | 1 |

Figure 2C:
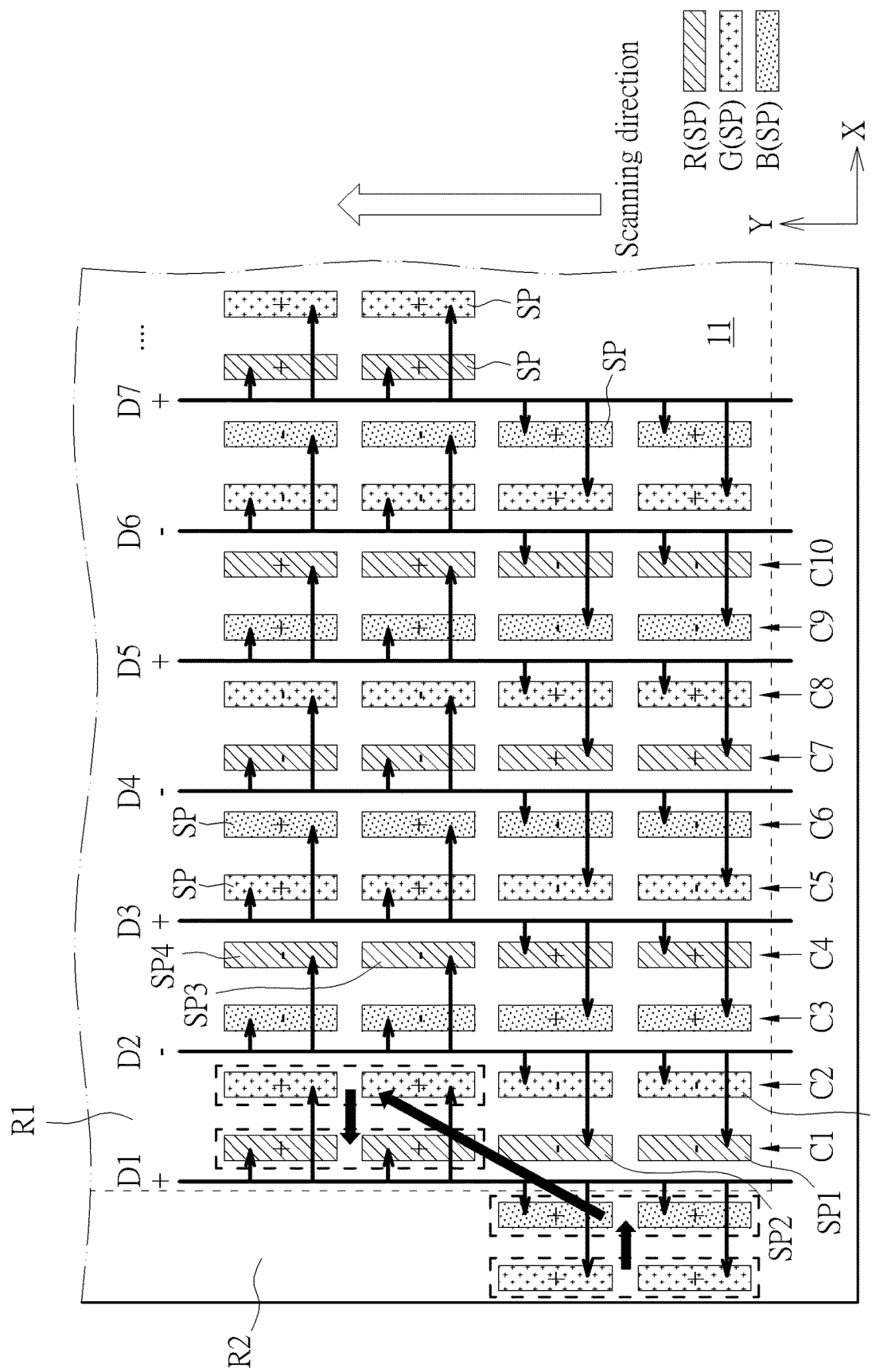

FIG. 2C is a partial plan view of the display device according to the first embodiment of the present disclosure, which shows the signal update sequence of each sub-pixel after the dual line gate (DLG) mode is turned on. The dual line gate mode described here is a signal update mode to reduce the screen resolution and improve the screen update rate. In simple terms, two adjacent sub-pixels SP with the same color will be charged at the same time in the dual line gate mode, so the number of sub-pixels SP that need to update the signal will be halved, and the two adjacent sub-pixels SP with the same color will display the same brightness. In this way, the screen update rate can be improved at the expense of slightly reducing some resolution.

One of the better conditions for turning on the dual line gate mode is that the adjacent sub-pixels SP are of the same color. It is still feasible to charge the sub-pixels with the same color but far away (non-adjacent) at the same time, but it will increase the complexity of scanning driving. In FIG. 2C, two adjacent sub-pixels SP with the same color in the same column are framed by dotted lines, and it can be found that the distribution positions of each sub-pixel SP in FIG. 2C are all adjacent, so the dual line gate mode can be turned on in FIG. 2C. In other words, the distribution and electrical connection of the sub-pixels in the first embodiment of this disclosure can also be applied to the dual line gate mode. Therefore, when the display screen needs to improve the update rate, the dual line gate mode can be properly turned on to improve the screen update rate. In addition, the order of scanning is indicated by thick arrows in FIG. 2C (the sub-pixel SP enclosed by dotted lines is regarded as two sub-pixels charged at the same time, so they will be scanned together). Taking the signal line D1 as an example, the two green sub-pixels G that are far away from the left side of the signal line D1 are updated earlier, then the two blue sub-pixels B that are close to the left side of the signal line D1 are updated, then the two green sub-pixels G that are far away from the right side of the signal line D1 are updated, and finally the two red sub-pixels R that are close to the right side of the signal line D1 are updated.

In the following, different embodiments of the distribution and electrical connection modes of the sub-pixels of the present disclosure will be described, and for the sake of simplifying the description, the following description will mainly focus on the differences of each embodiment, without repeating the similarities. In addition, the same elements in the embodiments of the present disclosure are labeled with the same reference numerals, so as to facilitate mutual comparison among the embodiments.

Figure 3A:
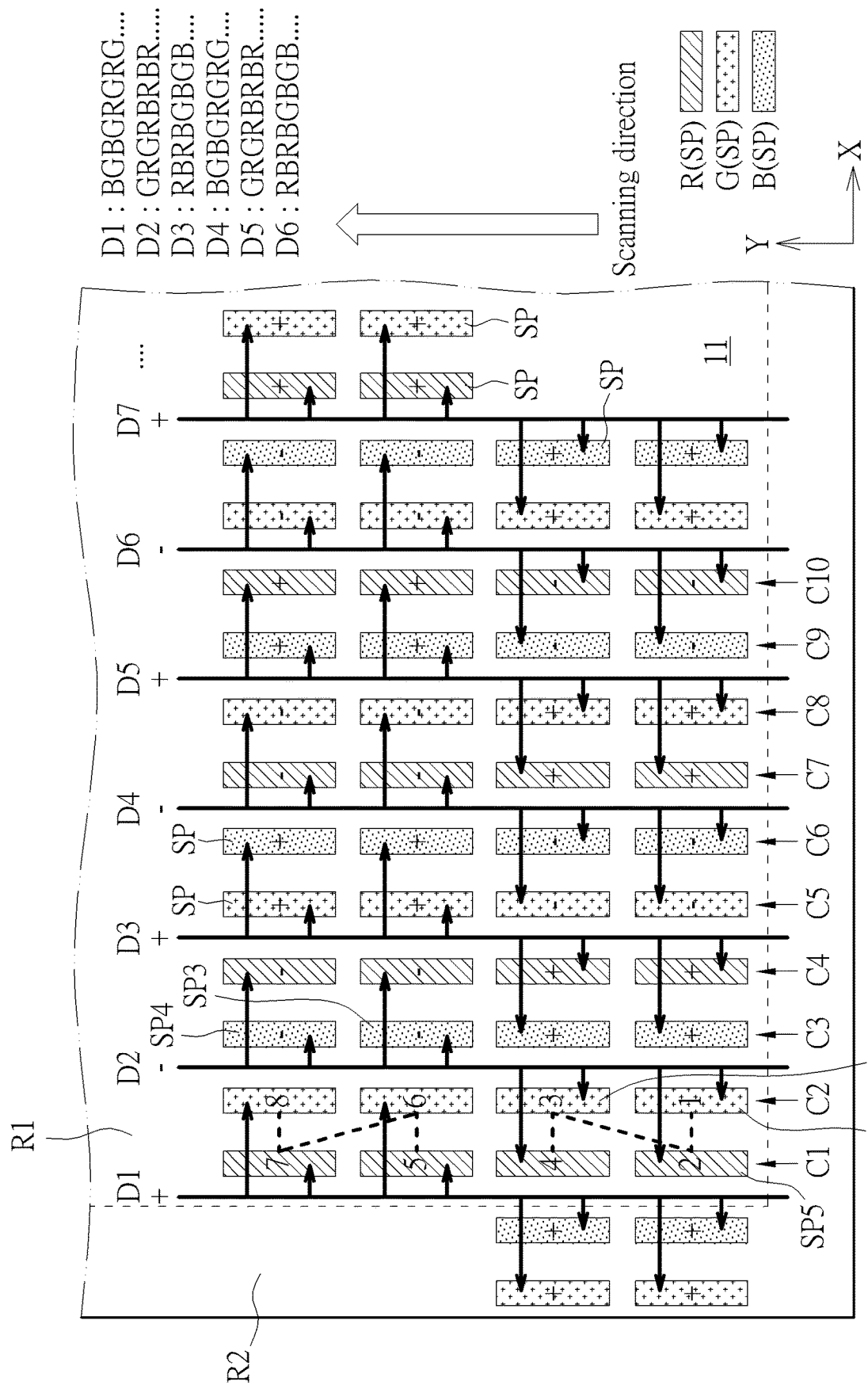
FIG. 3A shows a partial top view of the display device according to the second embodiment of the present disclosure, showing the signal update sequence of each sub-pixel.

FIG. 3A shows a partial top view of the display device according to the second embodiment of the present disclosure, showing the update sequence of each sub-pixel. As shown in FIG. 3A, most of the elements in this embodiment are the same as those in the above-mentioned first embodiment (the same as in FIG. 2A), so they are not repeated here. The main difference between this embodiment and the above-mentioned first embodiment is that the signal lines D1-D7 are electrically connected to each sub-pixel SP in a slightly different way. Taking the signal line D2 as an example, the order of updating sub-pixels is the green sub-pixel (G,1) on the left side of the signal line D2 and located in the second column C2, the red sub-pixel (R,2) on the left side of the signal line D2 and located in the first column C1, the green sub-pixel (G,3) on the left side of the signal line D2 and located in the second column C2, the red sub-pixel (R,4) on the left side of the signal line D2 and located in the first column C1, the blue sub-pixel (B) on the right side of signal line D2 and located in the third column C3, the red sub-pixel (R) on the right side of signal line D2 and located in the fourth column C4, the blue sub-pixel (B) on the right side of signal line D2 and located in the third column C3, the red sub-pixel (R) on the right side of signal line D2 and located in the fourth column C4. Reference can be made to the data mapping diagram on the right of FIG. 3A, in which the sub-pixel update sequence of signal lines D1-D6 is drawn, while signal line D7 is the same as signal line D1 and begins to repeat the cycle, and the electrical connection modes of other signal lines are so on.

In FIG. 3A, the order in which the signal of each sub-pixel SP is updated is indicated by numbers and dashed lines. Take the eight sub-pixels SP between the signal line D1 and the signal line D2 as an example, in which the four sub-pixels SP in the lower half are marked as 1, 2, 3 and 4 according to the signal update order, and the four sub-pixels SP in the lower half are connected (indicated by dotted lines) according to the signal update order to present a regular Z arrangement. On the other hand, the four sub-pixels SP in the upper half are labeled as 5, 6, 7, and 8 according to the signal update order, and the four sub-pixels SP in the upper half are connected (indicated by dotted lines) according to the signal update order, and then they are arranged in an inverted Z arrangement.

The structure shown in FIG. 3A (including the arrangement and electrical connection of sub-pixels) has similar advantages to the structure of the first embodiment (FIG. 2A). It can be observed from FIG. 3A that for any signal line D1-D7, some of the sub-pixels SP to which it is electrically connected are located on the left and the other is located on the right. In addition, from the polarity (symbol + or symbol −) of FIG. 3A, it can be found that there are no sub-pixels SP with the same polarity for each sub-pixel SP in the same column (Y direction). This can reduce the occurrence of vertical bright lines. In addition, as seen from FIG. 3A, among the sub-pixels SP in the same column (Y direction), some the sub-pixels that are updated earlier and the other are the sub-pixel that are updated later. Therefore, when the signals of the sub-pixels SP are updated in sequence, not all the sub-pixels that are updated earlier or all the sub-pixels that are updated later are arranged in the same column, so it is not easy to generate vertical lines of the display screen and improve the quality of the display screen.

Figure 3B:
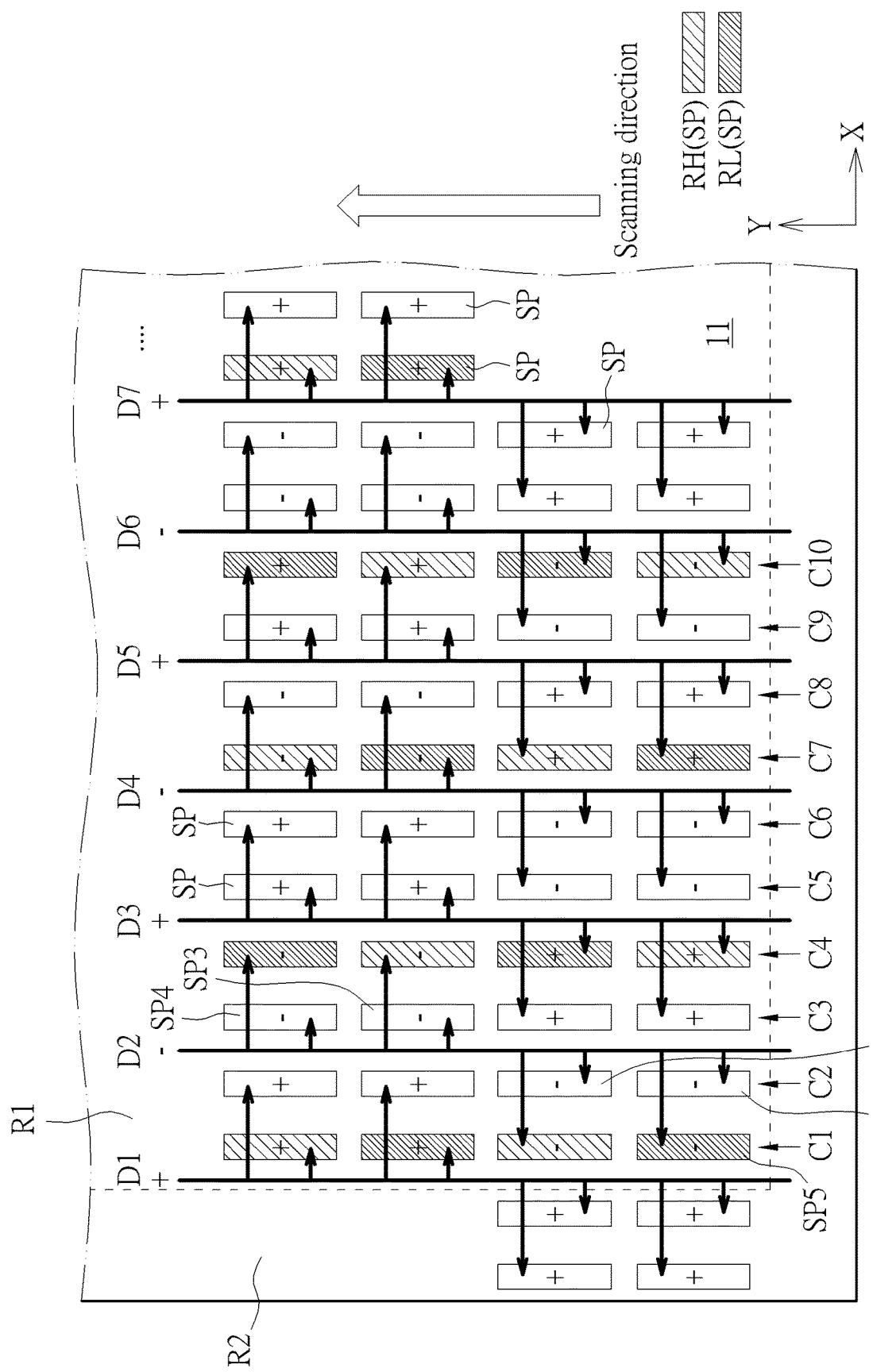

FIG. 3B shows a partial top view of the high and low voltage and positive and negative signals of the red sub-pixel after the electronic low color shift mode is turned on according to the second embodiment of the present disclosure. In FIG. 3B, similarly to FIG. 2B of the first embodiment, this embodiment only discusses the red sub-pixel R (refer to the position of the red sub-pixel R in FIG. 3A), and other blue sub-pixels and green sub-pixels are not discussed here. In order to clearly show the characteristics on the figure, the blue sub-pixels and green sub-pixels are represented with a blank pattern. Similar to the above-mentioned first embodiment, after the electronic low color shift mode is turned on, it can be found from FIG. 3B and Table 2 below that in any column of red sub-pixel R (the first column C1, the fourth column C4, the seventh column C7 and the tenth column C10), the number of sub-pixels SP in the above four polarity and brightness groups is equal. Take table 2 as an example, within the range depicted in FIG. 3B, the numbers of the sub-pixels SP with high brightness and positive polarity H(+), low brightness and positive polarity L(+), high brightness and negative polarity H(−) and low brightness and negative polarity H (−) are all 1. Similarly, in other columns, blue sub-pixels and green sub-pixels are also distributed in this way. That is to say, under the arrangement of sub-pixels shown in FIG. 3B, after the electronic low color shift mode is turned on, the polarity distribution and bright-dark distribution among sub-pixels SP still show an average distribution, thus reducing the probability of display defects such as shake head.

TABLE 2

|  | H(+) | H(−) | L(+) | L(−) |
| --- | --- | --- | --- | --- |
| C1 | 1 | 1 | 1 | 1 |
| C4 | 1 | 1 | 1 | 1 |
| C7 | 1 | 1 | 1 | 1 |
| C10 | 1 | 1 | 1 | 1 |

Figure 3C:
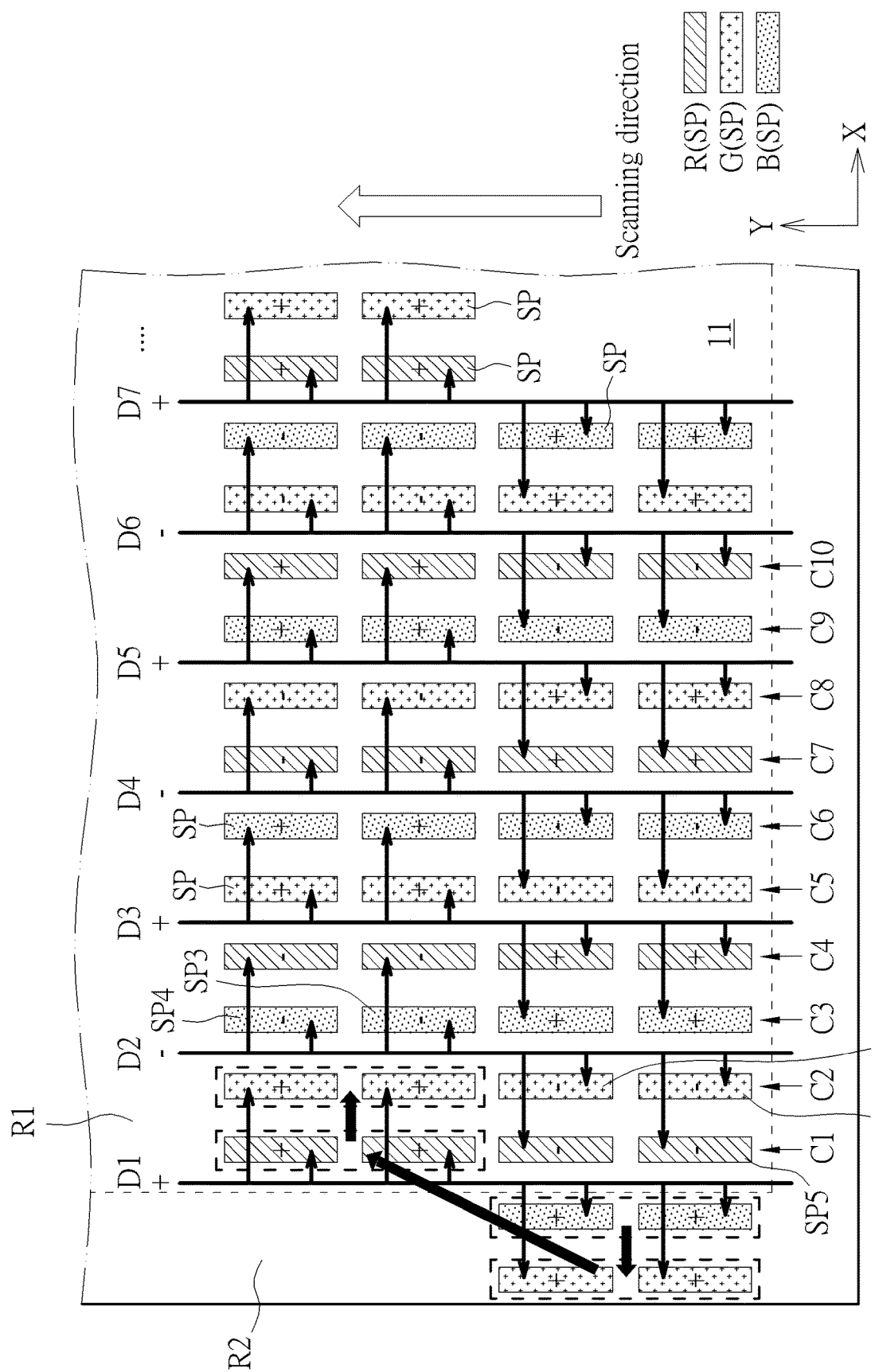

FIG. 3C shows a partial top view of the display device according to the second embodiment of the present disclosure, which shows the signal update sequence of each sub-pixel after the dual line gate mode is turned on. The conditions for turning on the dual line gate mode are as described above and will not be repeated here. Similarly to the first embodiment (FIG. 2C), in FIG. 3C, two adjacent sub-pixels SP with the same color are framed by dotted lines, and it can be found that the distribution positions of the sub-pixels SP in FIG. 3C are all adjacent, so the dual line gate mode can be turned on in FIG. 3C. In other words, the distribution and electrical connection of sub-pixels in the second embodiment of this disclosure can also be applied to the dual line gate mode. Therefore, when the display screen needs to improve the update rate, the dual line gate mode can be properly turned on to improve the screen update rate. In addition, in FIG. 3C, the order of signal updating is indicated by thick arrows (the sub-pixel SP framed by dotted lines is regarded as two sub-pixels charged at the same time, so the signals will be updated together). Taking the signal line D1 as an example, firstly, two blue sub-pixels B with close distance on the left side of the signal line D1 are updated, then two green sub-pixels G with far distance on the left side of the signal line D1 are updated, then two red sub-pixels R with close distance on the right side of the signal line D1 are updated, and finally, two green sub-pixels G with far distance on the right side of the signal line D1 are updated.

Figure 4A:
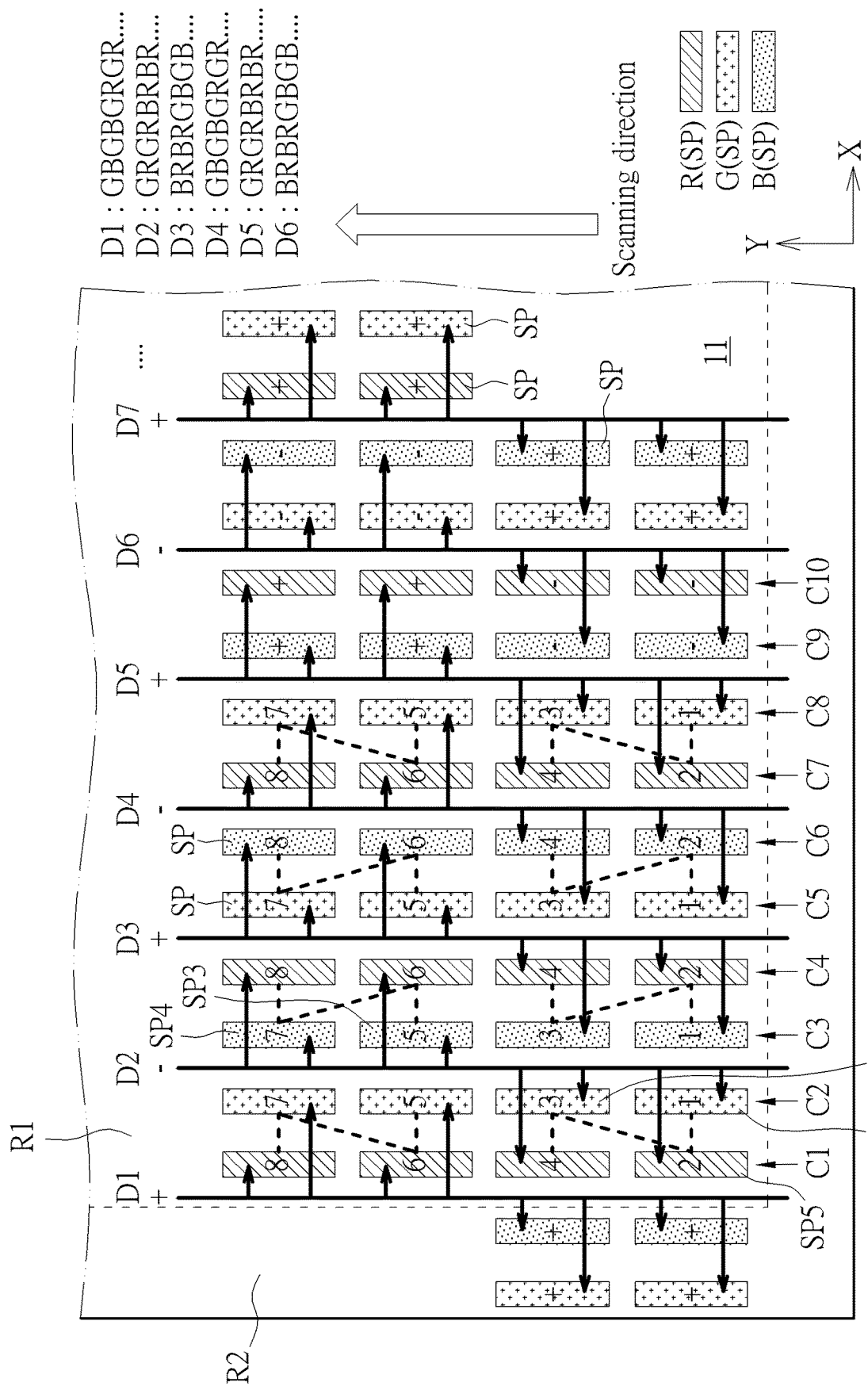
FIG. 4A shows a partial top view of the display device according to the third embodiment of the present disclosure, showing the signal update sequence of each sub-pixel.

FIG. 4A shows a partial top view of the display device according to the third embodiment of the present disclosure, showing the signal update sequence of each sub-pixel. As shown in FIG. 4A, most of the elements in this embodiment are the same as those in the above-mentioned first embodiment (the same as in FIG. 2A), so they are not repeated here. The main difference between this embodiment and the above-mentioned first embodiment is that the signal lines D1-D7 are electrically connected to each sub-pixel SP in a slightly different way. Taking the signal line D2 as an example, the order of updating sub-pixels is the green sub-pixel (G,1) on the left side of the signal line D2 in the second column C2, the red sub-pixel (R,2) on the left side of the signal line D2 in the first column C1, the green sub-pixel (G,3) on the left side of the signal line D2 in the second column C2, the red sub-pixel (R,4) on the left side of the signal line D2 in the first column C1, the blue sub-pixel (B,5) on the right side of signal line D2 in the third column C3, the red sub-pixel (R,6) on the right side of signal line D2 in the fourth column C4, the blue sub-pixel (B,7) on the right side of signal line D2 in the third column C3, and the red sub-pixel (R,8) on the right side of signal line D2 in the fourth column C4, the signal update sequence diagram on the right can be simply represented as D2:GRGRBRBR. Taking the signal line D3 as an example, the order of signal updating sub-pixels is the blue sub-pixel (B,1) on the left side of the signal line D3 located in the third column C3, the red sub-pixel (R,2) on the left side of the signal line D3 located in the fourth column C4, the blue sub-pixel (B,3) on the left side of the signal line D3 located in the third column C3, the red sub-pixel (R,4) on the left side of the signal line D3 located in the fourth column C4, the green sub-pixel (G, 5) on the right of signal line D3 located in the fifth column C5, the blue sub-pixel (B, 6) on the right of signal line D3 located in the sixth column C6, the green sub-pixel (G, 7) on the right of signal line D3 located in the fifth column C5, the blue sub-pixel (B, 8) on the right of signal line D3 located in the sixth column C6, the signal update sequence diagram on the right can be simply represented as D3:BRBRGBGB. The electrical connection modes of the remaining signal lines D1-D7 are shown with reference to FIG. 4A. Reference can be made to the data mapping diagram on the right of FIG. 4A, in which the sub-pixel signal update sequence of signal lines D1-D6 are drawn, while signal line D7 is the same as signal line D1 and begins to repeat the cycle, and the electrical connection modes of other signal lines are so on.

In FIG. 4A, the order in which the signal of each sub-pixel SP is updated is indicated by numbers and dashed lines. In FIG. 4A, numbers 1, 2, 3 and 4 or numbers 5, 6, 7 and 8 indicate the order in which the SP signals of four adjacent sub-pixels are updated. Among them, some signal updates of four adjacent sub-pixels SP present regular Z arrangement, while others present inverted Z arrangement. The structure shown in FIG. 4A (including the arrangement and electrical connection of sub-pixels) has similar advantages to the structure of the first embodiment (FIG. 2A). It can be observed from FIG. 4A that for any signal line D1-D7, some of the sub-pixels SP electrically connected to it are located on the left side of the signal line, while the others located on the right side of the signal line. In addition, from the polarity (symbol "+" or symbol "−") of FIG. 4A, it can be found that for the same column (Y direction), there is no arrangement in which all sub-pixels SP have the same polarity. This can reduce the occurrence of vertical bright lines. In addition, as shown in FIG. 4A, the blue sub-pixels B in the third column C3 are all updated earlier, while the blue sub-pixels B in the sixth column C6 are all updated later, so blue may produce slight straight stripes on the display screen, but red and green are less problematic, because as shown in FIG. 4A, the columns containing red sub-pixels (for example, the first column C1, the fourth column C4, the seventh column C7 and the tenth column C10) are all updated later sub-pixels, while the columns containing green sub-pixels (for example, the second column C2, the fifth column C5 and the eighth column C8) are all updated earlier sub-pixels. Therefore, red and green are less likely to produce straight stripes on the display.

In the structure of this embodiment, according to the arrangement order of the sub-pixel colors, although one of the colors (red, blue and green) may produce a display screen with straight stripes, however, human eyes are less sensitive to the recognition of blue, so blue is selected as the color of straight stripes, which can reduce the visual discomfort of users.

Figure 4B:
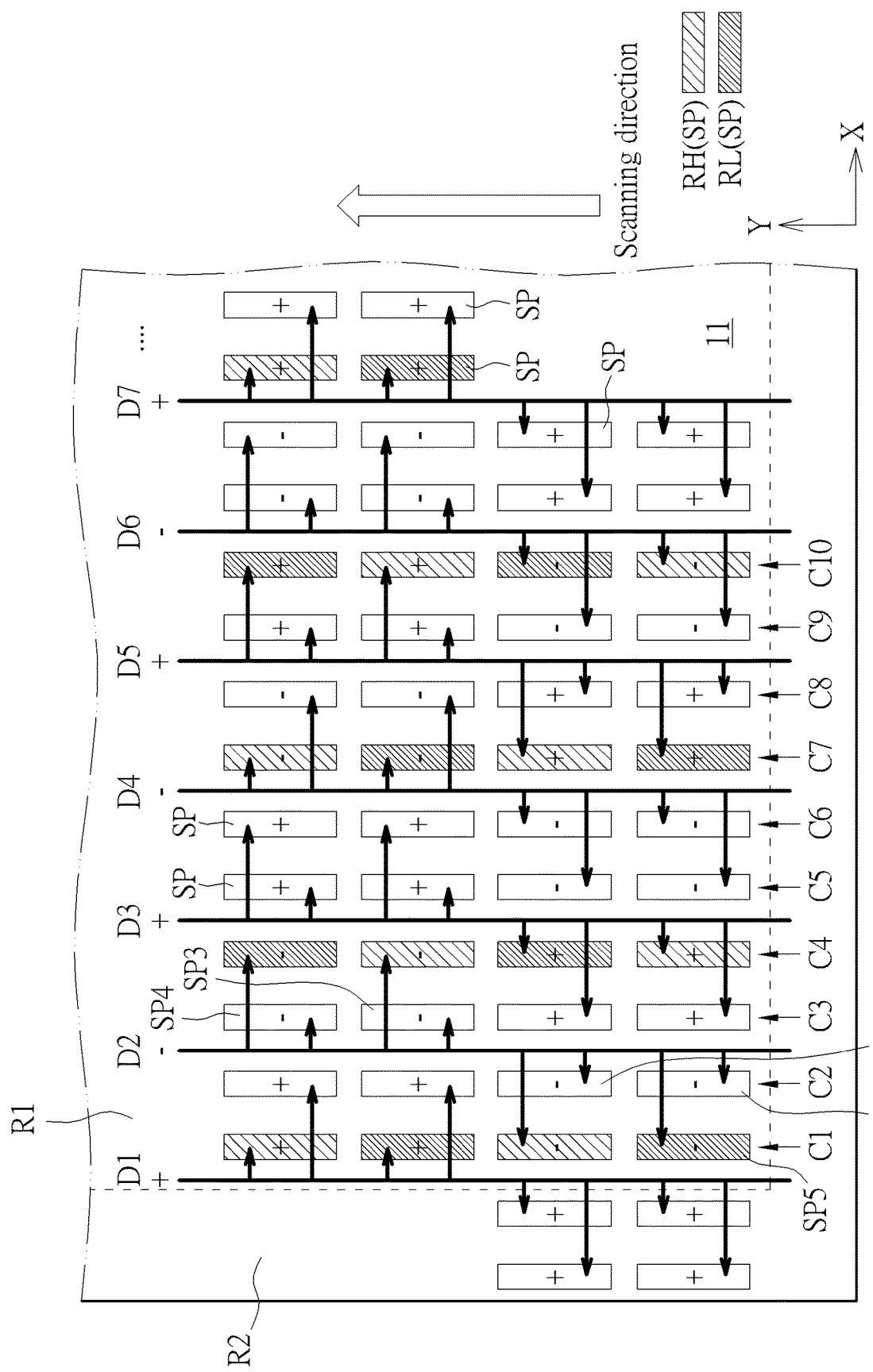

FIG. 4B shows a partial top view of the high and low voltage and positive and negative signals of the red sub-pixel after the electronic low color shift mode is turned on according to the third embodiment of the present disclosure. In FIG. 4B, similarly to FIG. 2B of the first embodiment, this embodiment only discusses the red sub-pixel R (refer to the position of the red sub-pixel R in FIG. 4A), and other blue sub-pixels and green sub-pixels are not discussed here. In order to clearly show the characteristics on the figure, the blue sub-pixels and green sub-pixels are represented with a blank pattern. Similar to the first embodiment, after the electronic low color shift mode is turned on, it can be found from FIG. 4B and Table 3 below that in any column of red sub-pixel R (the first column C1, the fourth column C4, the seventh column C7 and the tenth column C10), the number of sub-pixels SP in the above four polarity and brightness groups is equal. Take table 3 as an example, within the range depicted in FIG. 4B, the numbers of the sub-pixels SP with high brightness and positive polarity H(+), low brightness and positive polarity L(+), high brightness and negative polarity H(−) and low brightness and negative polarity H (−) are all 1. Similarly, in other columns, blue sub-pixels and green sub-pixels are also distributed in this way. That is to say, under the arrangement of sub-pixels shown in FIG. 4B, after the electronic low color shift mode is turned on, the polarity distribution and bright-dark distribution among sub-pixels SP still show an average distribution, thus reducing the probability of display defects such as shake head.

TABLE 3

|  | H(+) | H(−) | L(+) | L(−) |
| --- | --- | --- | --- | --- |
| C1 | 1 | 1 | 1 | 1 |
| C4 | 1 | 1 | 1 | 1 |
| C7 | 1 | 1 | 1 | 1 |
| C10 | 1 | 1 | 1 | 1 |

Figure 4C:
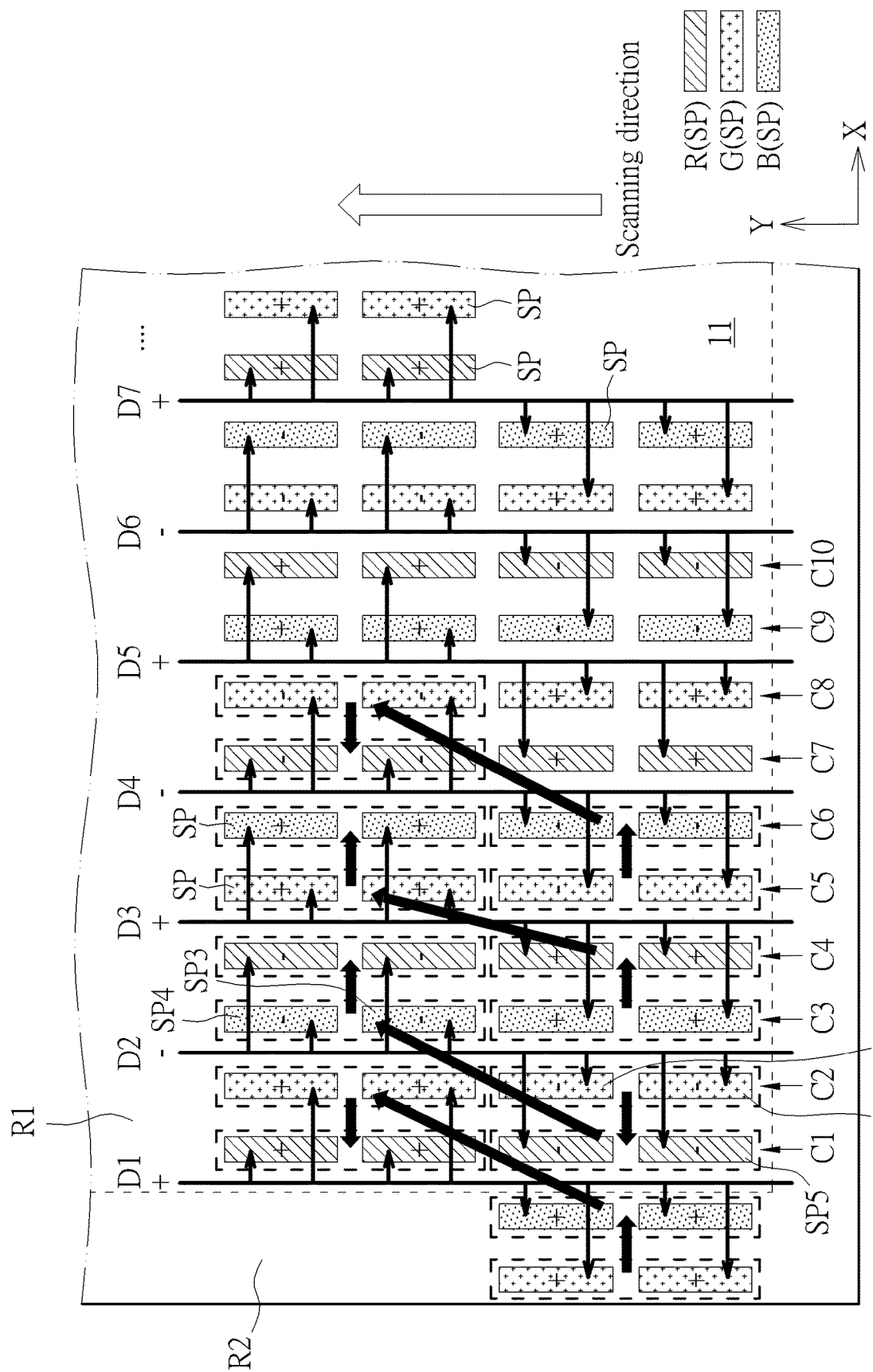

FIG. 4C is a partial top view of the display device according to the third embodiment of the present disclosure, which shows the signal update sequence of each sub-pixel after the dual line gate mode is turned on. The conditions for turning on the dual line gate mode are as described above and will not be repeated here. Similarly to the first embodiment (FIG. 2C), in FIG. 4C, two adjacent sub-pixels SP with the same color are framed by dotted lines, and it can be found that the distribution positions of the sub-pixels SP in FIG. 4C are all adjacent, so the dual line gate mode can be turned on in FIG. 4C. In other words, the distribution and electrical connection of sub-pixels in the third embodiment of the present disclosure can also be applied to the dual line gate mode. Therefore, when the display screen needs to improve the update rate, the dual line gate mode can be properly turned on to improve the screen update rate. In addition, in FIG. 4C, the order of signal updating is indicated by thick arrows (the sub-pixel SP framed by dotted lines is regarded as two sub-pixels that are charged at the same time, so the signals will be updated together). Taking the signal line D1 as an example, the two green sub-pixels G that are far away from the left side of the signal line D1 are updated earlier, then the two blue sub-pixels B that are close to the left side of the signal line D1 are updated, then the two green sub-pixels G that are far away from the right side of the signal line D1 are updated, and finally the two red sub-pixels R that are close to the right side of the signal line D1 are updated.

Figure 5A:
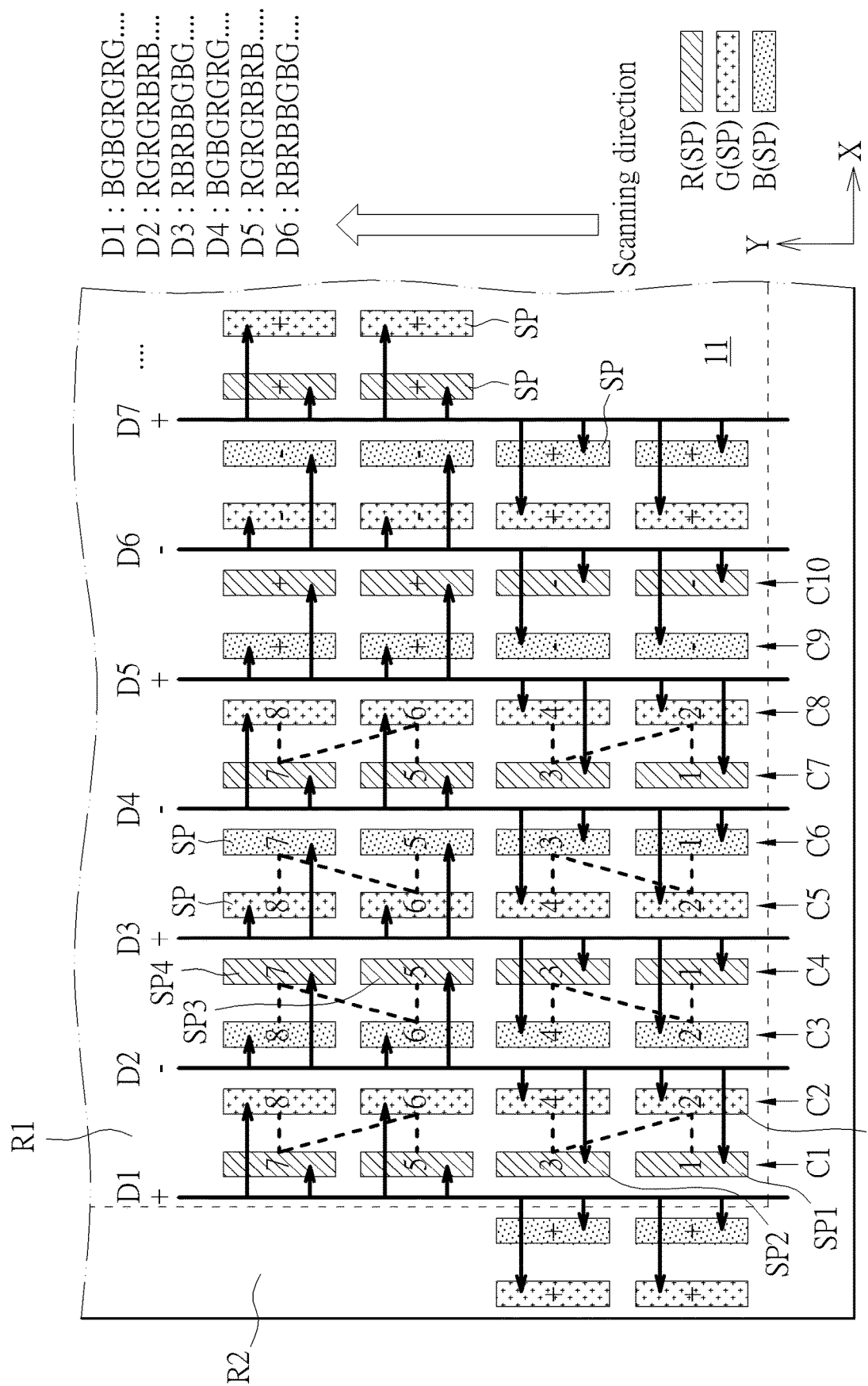
FIG. 5A shows a partial top view of the display device according to the fourth embodiment of the present disclosure, showing the signal update sequence of each sub-pixel.

FIG. 5A shows a partial top view of the display device according to the fourth embodiment of the present disclosure, showing the signal update sequence of each sub-pixel. As shown in FIG. 5A, most of the elements in this embodiment are the same as those in the above-mentioned third embodiment (the same as in FIG. 4A), so they are not repeated here. The main difference between this embodiment and the above-mentioned third embodiment is that the signal lines D1-D7 are electrically connected to the sub-pixels SP in a slightly different way. Taking the signal line D2 as an example, the order of signal updating sub-pixels is the red sub-pixel (R,1) on the left side of the signal line D2 in the first column C1, the green sub-pixel (G,2) on the left side of the signal line D2 in the second column C2, the red sub-pixel (R,3) on the left side of the signal line D2 in the first column C1, the green sub-pixel (G,4) on the left side of the signal line D2 in the second column C2, the red sub-pixel (R,5) on the right side of signal line D2 in the fourth column C4, the blue sub-pixel (B,6) on the right side of signal line D2 in the third column C3, the red sub-pixel (R,8) on the right side of signal line D2 in the fourth column C4, and the blue sub-pixel (B,7) on the right side of signal line D2 in the third column C3, the signal update sequence diagram on the right can be simply represented as D2:RGRGRBRB. Taking the signal line D3 as an example, the order of signal updating sub-pixels is the red sub-pixel (R,1) on the left side of the signal line D3 located in the fourth column C4, the blue sub-pixel (B,2) on the left side of the signal line D3 located in the third column C3, the red sub-pixel (R,3) on the left side of the signal line D3 located in the fourth column C4, the blue sub-pixel (B,4) on the left side of the signal line D3 located in the third column C3, the blue sub-pixel (B, 5) on the right of signal line D3 located in the sixth column C6, the green sub-pixel (G, 6) on the right of signal line D3 located in the fifth column C5, the blue sub-pixel (B, 7) on the right of signal line D3 located in the sixth column C6, and the green sub-pixel (G, 8) on the right of signal line D3 located in the fifth column C5, the signal update sequence diagram on the right can be simply represented as D3:RBRBBGBG. The electrical connection modes of the remaining signal lines D1-D7 are shown with reference to FIG. 5A. Reference can be made to the data mapping diagram on the right of FIG. 5A, in which the sub-pixel signal update sequence of signal lines D1-D6 is drawn, while signal line D7 is the same as signal line D1 and begins to repeat the cycle, and the electrical connection modes of other signal lines are so on.

In FIG. 5A, the order in which the signal of each sub-pixel SP is updated is indicated by numbers and dashed lines. In FIG. 5A, numbers 1, 2, 3 and 4 or numbers 5, 6, 7 and 8 indicate the order in which the SP signals of four adjacent sub-pixels are updated. Among them, some of the adjacent four sub-pixels SP show regular Z arrangement, while others show inverted Z arrangement. The structure shown in FIG. 5A (including the arrangement and electrical connection of sub-pixels) has similar advantages to the structure of the first embodiment (FIG. 2A). It can be observed from FIG. 5A that for any signal line D1-D7, some of the electrically connected sub-pixels SP are located on the left side of the signal line, while some of the electrically connected sub-pixels SP are located on the right side of the signal line. In addition, from the polarity (symbol "+" or symbol "−") of FIG. 5A, it can be found that for the same column (Y direction), there is no arrangement in which all sub-pixels SP have the same polarity. This can reduce the occurrence of vertical bright lines. In addition, as shown in FIG. 5A, the blue sub-pixels B in the third column C3 are all later updated sub-pixels, while the blue sub-pixels B in the sixth column C6 are all earlier updated sub-pixels, so blue may produce slight straight stripes on the display screen, but red and green are less problematic, for the reasons mentioned above, which will not be repeated here.

In the structure of this embodiment, as mentioned above, choosing blue as the color to produce straight stripes can reduce the user's visual discomfort.

Figure 5B:
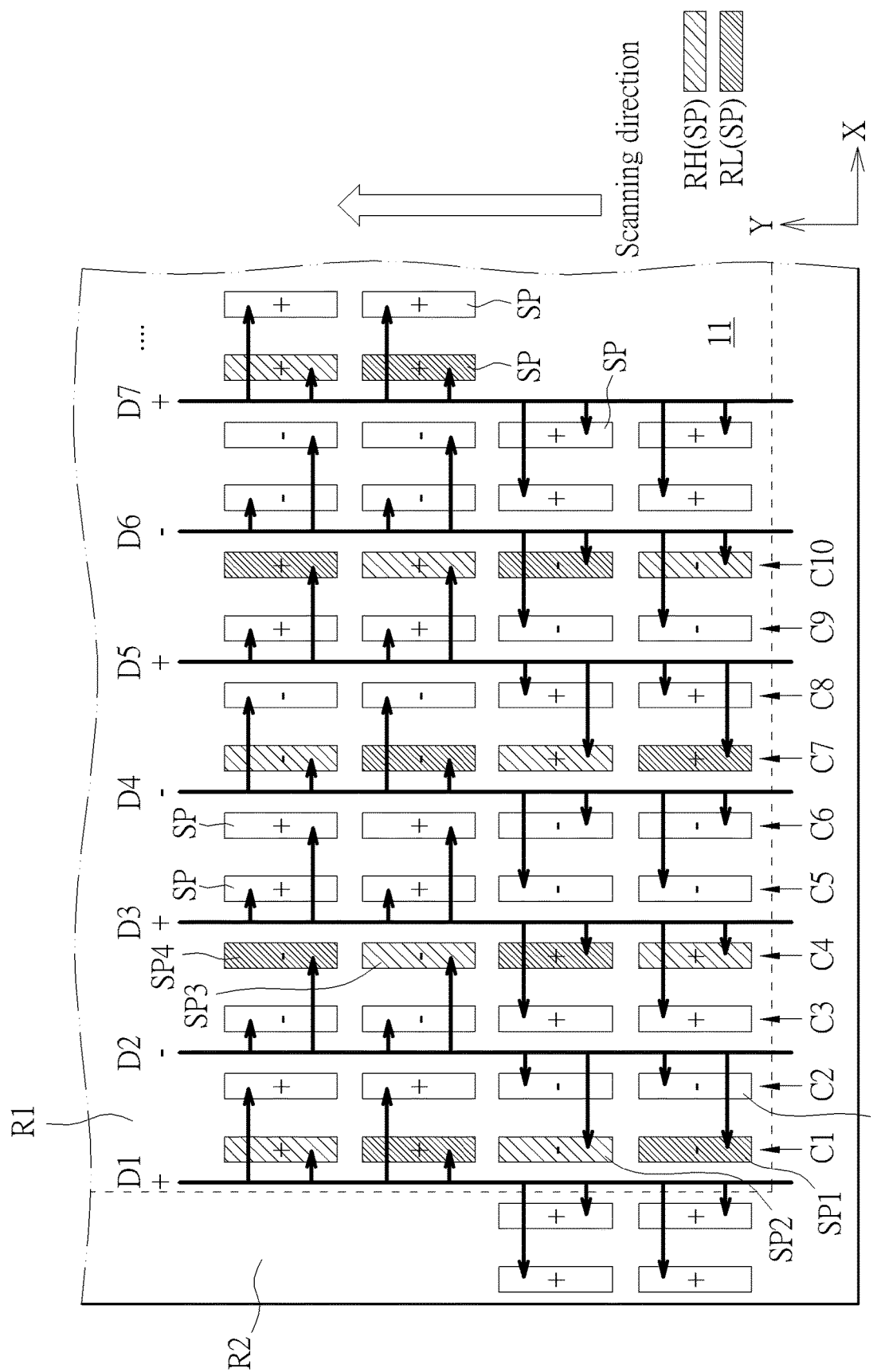

FIG. 5B shows a partial top view of the high and low voltage and positive and negative signals of the red sub-pixel after the electronic low color shift mode is turned on according to the fourth embodiment of the present disclosure. In FIG. 5B, similarly to FIG. 2B of the first embodiment, this embodiment only discusses the red sub-pixel R (refer to the position of the red sub-pixel R in FIG. 5A), and other blue sub-pixels and green sub-pixels are not discussed here. In order to clearly show the characteristics on the figure, the blue sub-pixels and green sub-pixels are represented with a blank pattern. Similar to the first embodiment, after the electronic low color shift mode is turned on, it can be found from FIG. 5B and Table 4 below that in any column of red sub-pixel R (the first column C1, the fourth column C4, the seventh column C7 and the tenth column C10), the number of sub-pixels SP in the above four polarity and brightness groups is equal. Take table 4 as an example, within the range depicted in FIG. 5B, the numbers of the sub-pixels SP with high brightness and positive polarity H(+), low brightness and positive polarity L(+), high brightness and negative polarity H(−) and low brightness and negative polarity H (−) are all 1. Similarly, in other columns, blue sub-pixels and green sub-pixels are also distributed in this way. That is to say, under the arrangement of sub-pixels shown in FIG. 5B, after the electronic low color shift mode is turned on, the polarity distribution and bright-dark distribution among sub-pixels SP still show an average distribution, thus reducing the probability of display defects such as shake head.

TABLE 4

|  | H(+) | H(−) | L(+) | L(−) |
| --- | --- | --- | --- | --- |
| C1 | 1 | 1 | 1 | 1 |
| C4 | 1 | 1 | 1 | 1 |
| C7 | 1 | 1 | 1 | 1 |
| C10 | 1 | 1 | 1 | 1 |

Figure 5C:
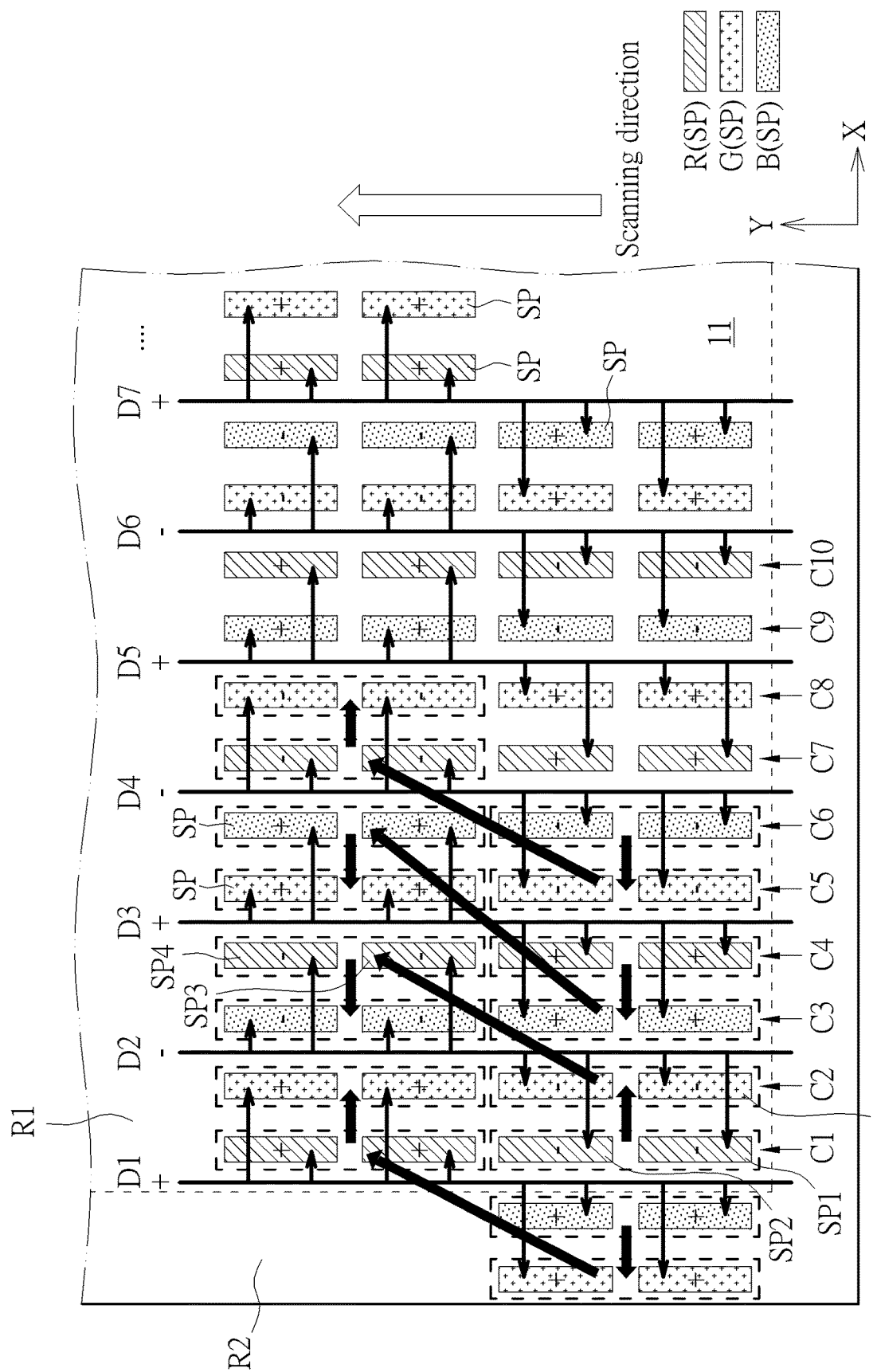

FIG. 5C shows a partial top view of the display device according to the fourth embodiment of the present disclosure, which shows the signal update sequence of each sub-pixel after the dual line gate mode is turned on. The conditions for turning on the dual line gate mode are as described above and will not be repeated here. Similarly to the above-mentioned third embodiment (FIG. 4C), in FIG. 5C, two adjacent sub-pixels SP with the same color are framed by dotted lines, and it can be found that the distribution positions of each sub-pixel SP in FIG. 5C are all adjacent, so the dual line gate mode can be turned on in FIG. 5C. In other words, the distribution and electrical connection of sub-pixels in the fourth embodiment of the present disclosure can also be applied to the dual line gate mode. Therefore, when the display screen needs to improve the update rate, the dual line gate mode can be properly turned on to improve the screen update rate. In addition, in FIG. 5C, the order of signal updating is indicated by thick arrows (the sub-pixel SP framed by dotted lines is regarded as two sub-pixels charged at the same time, so the signals will be updated together). Taking the signal line D1 as an example, firstly, two blue sub-pixels B with close distance on the left side of the signal line D1 are updated, then two green sub-pixels G with far distance on the left side of the signal line D1 are updated, then two red sub-pixels R with close distance on the right side of the signal line D1 are updated, and finally, two green sub-pixels G with far distance on the right side of the signal line D1 are updated.

Figure 6A:
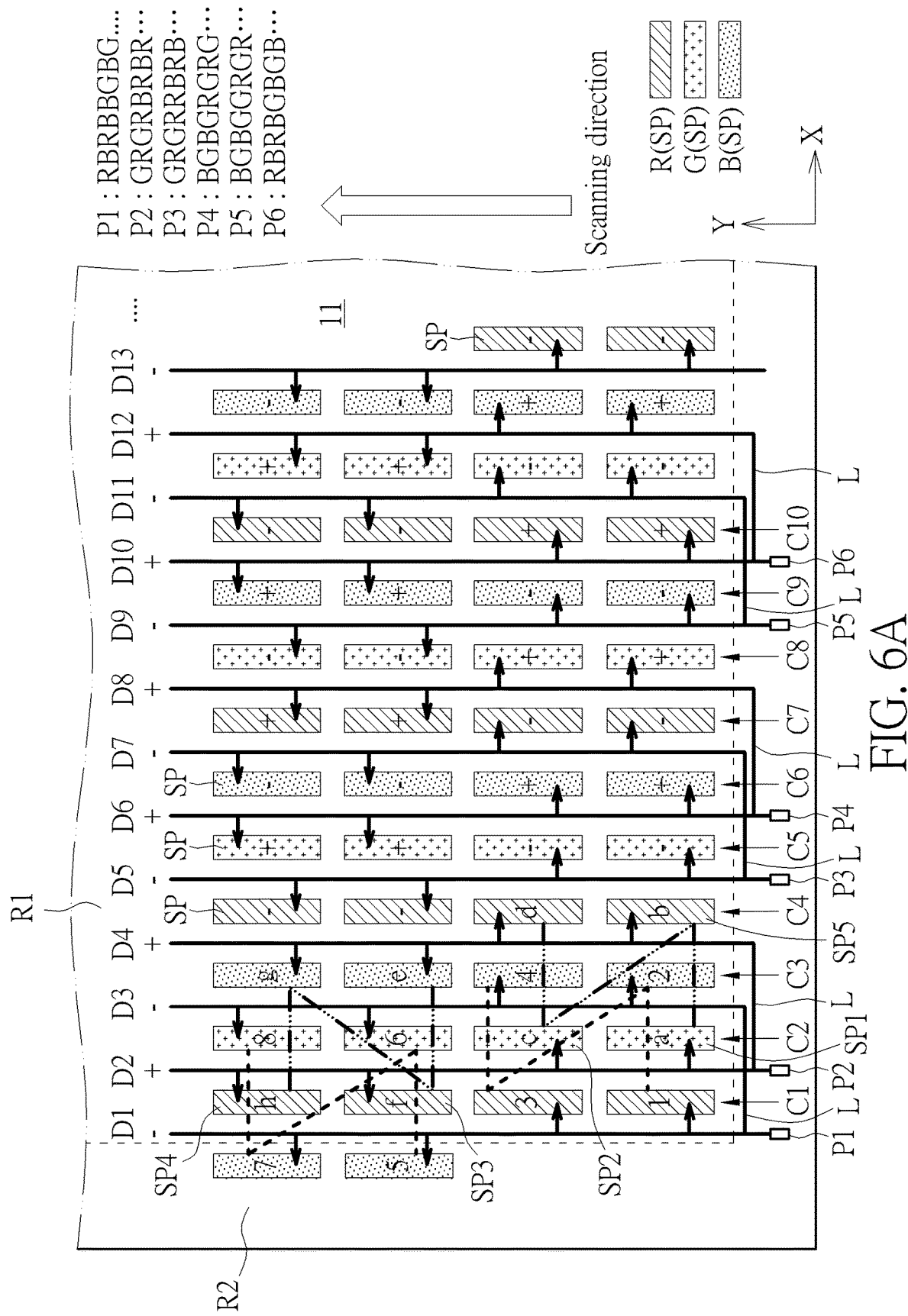
FIG. 6A shows a partial top view of the display device according to the fifth embodiment of the present disclosure, showing the signal update sequence of each sub-pixel.

FIG. 6A shows a partial top view of the display device according to the fifth embodiment of the present disclosure, showing the signal update sequence of each sub-pixel. As shown in FIG. 6A, most of the elements in this embodiment are the same as those in the above-mentioned first embodiment (the same as in FIG. 2A) and will not be repeated here. The main difference between this embodiment and the first embodiment is that the arrangement of signal lines D1-D13 and sub-pixel SP is slightly different. In the first embodiment, two columns of sub-pixels SP are included between two adjacent signal lines, while in this embodiment, one column of sub-pixels SP is included between two adjacent signal lines. Therefore, in this embodiment, one sub-pixel SP is defined as the range surrounded by two adjacent signal lines and two adjacent scanning lines (as shown in FIG. 1B). In addition, in this embodiment, at least two of the odd signal lines may be electrically connected to the signal driving integrated circuit (not shown) after being electrically connected with the line L in the peripheral region R2, and similarly, at least two of the even signal lines may be electrically connected to the signal driving integrated circuit after being electrically connected with the line L in the peripheral region R2. For example, the signal line D1 and the signal line D3 are electrically connected to the pad P1 in the peripheral region R2 by the line L, and the signal line D2 and the signal line D4 are electrically connected to the pad P2 in the peripheral region R2 by the line L. In this way, only two signal output terminals are electrically connected to the pad P1 and the pad P2 to provide data signals for the four signal lines D1 to D4, thus saving the usage of the signal driving integrated circuit and reducing the cost. Similarly, other signal lines are also electrically connected in a similar way. Signal line D5 and signal line D7 are electrically connected to the pad P3 in the peripheral region R2, signal line D6 and signal line D8 are electrically connected to the pad P4 in the peripheral region R2, signal line D9 and signal line D11 are electrically connected to the pad P5 in the peripheral region R2, and signal line D10 and signal line D12 are electrically connected to the pad P6 in the peripheral region R2. Refer to FIG. 6A for details. Other areas not shown in the range of FIG. 6A also include other pads connected to the signal lines in this arrangement.

As for the signal updating sequence of each sub-pixel, please refer to FIG. 6A. Taking the pad P1 electrically connected to the signal line D1 and the signal line D3 as an example, the sequence of updating the signal of the sub-pixel SP from bottom to top is the red sub-pixel (R,1) on the right side of the signal line D1 in the first column C1, the blue sub-pixel (B,2) on the right side of the signal line D3 in the third column C3, the red sub-pixel (R,3) on the right side of the signal line D1 in the first column C1, the blue sub-pixel (B,4) on the right side of the signal line D3 in the third column C3, the blue sub-pixel (B, 5) on the left side of signal line D1 in the peripheral region R2, the green sub-pixel (G, 6) on the left side of signal line D3 in the second column C2, the blue sub-pixel (B, 7) on the left side of signal line D1 in the peripheral region R2, and the green sub-pixel (G, 7) on the left side of signal line D3 in the second column C2. It can be abbreviated as P1:RBRBBGBG, reference can be made to the data mapping diagram on the right side of FIG. 6A, in which the sub-pixel signal update sequence of pads P1-P6 is drawn, while the signal update sequence of pad P7 is the same as that of pad P1 and begins to repeat the cycle, and so on for the subsequent electrical connection mode and signal update sequence.

In FIG. 6A, the order in which each sub-pixel SP is scanned is indicated by numbers, English letters and dashed lines. In FIG. 6A, numbers 1, 2, 3, 4 or numbers 5, 6, 7, 8 and English letters a, b, c, d or English letters e, f, g, h indicate the order in which sub-pixel SP signals of four adjacent sub-pixels are updated. Among them, some of the sub-pixel SP signal update sequences of four adjacent sub-pixels present a regular Z arrangement, while others present inverted Z arrangement. The structure shown in FIG. 6A (including the arrangement and electrical connection of sub-pixels) has similar advantages to the structure of the first embodiment (FIG. 2A). It can be observed from FIG. 6A that for any signal line D1-D13, some of the electrically connected sub-pixels SP are located on the left side of the signal line, while some of the electrically connected sub-pixels SP are located on the right side of the signal line. In addition, from the polarity (symbol "+" or symbol "−") of FIG. 6A, it can be found that for the same column (Y direction), there is no arrangement in which all sub-pixels SP have the same polarity. This can reduce the occurrence of vertical bright lines. In addition, in this embodiment, because signal lines are arranged between the sub-pixels SP in the same row, the distance between the sub-pixels SP in the same row is far enough, so this embodiment also reduces the problem that the display screen produces straight stripes when the sub-pixels are updated, and can improve the quality of the display screen.

It is worth noting that the numbers 1, 2, 3, 4, 5, 6, 7, 8 and English letters A, B, C, D, E, F, G, H or symbols "+" and "−" in this embodiment and the following embodiments are used to clearly indicate the signal update order of adjacent sub-pixels SP and the polarity of sub-pixels, and these numbers/symbols/letters do not represent the reference numbers of components.

Figure 6B:
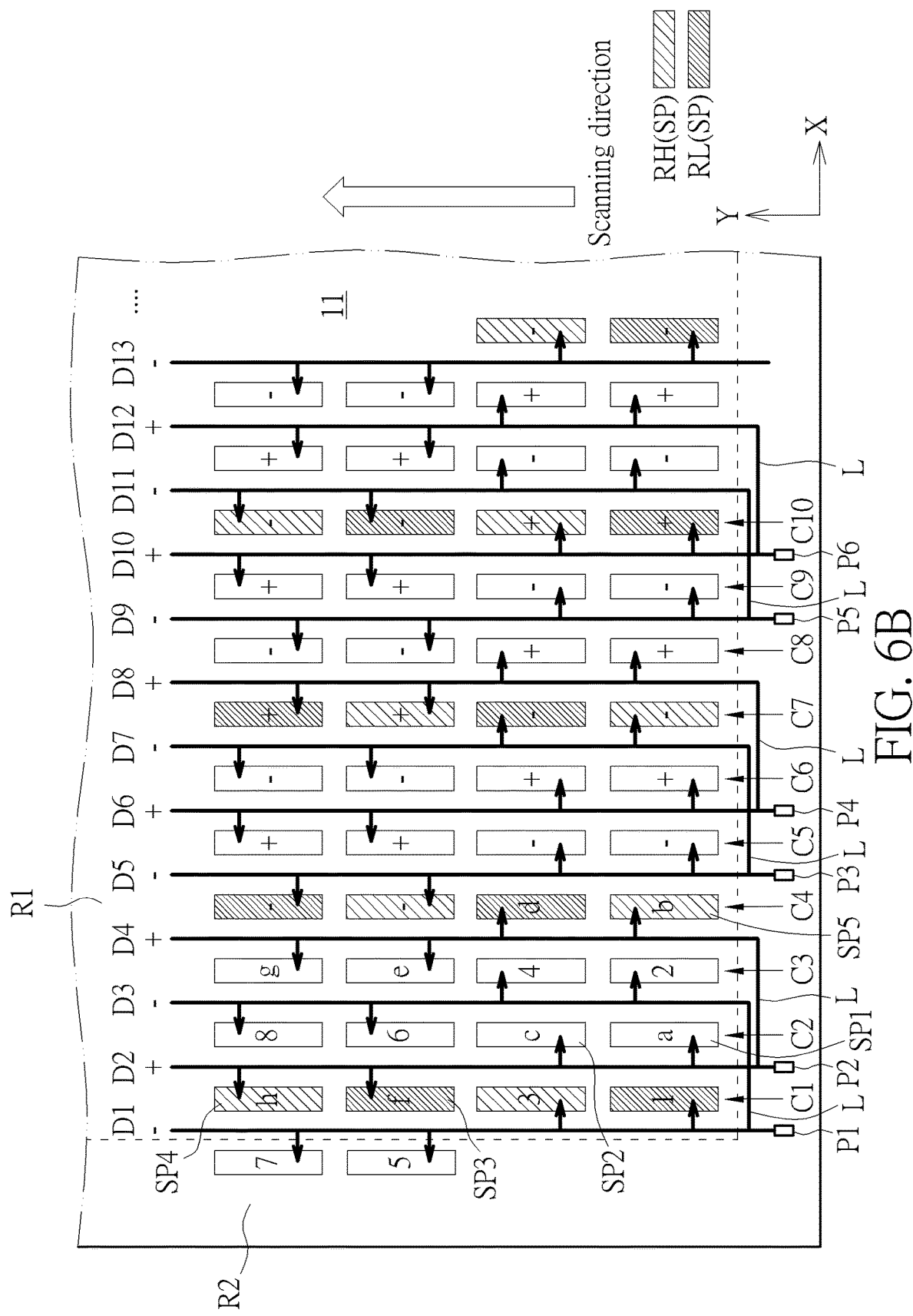

FIG. 6B shows a partial top view of the high and low voltage and positive and negative signals of the red sub-pixel after the electronic low color shift mode is turned on according to the fifth embodiment of the present disclosure. In FIG. 6B, similarly to FIG. 2B of the first embodiment, this embodiment only discusses the red sub-pixel R (refer to the position of the red sub-pixel R in FIG. 6A), and other blue sub-pixels and green sub-pixels are not discussed here. In order to clearly show the characteristics on the figure, the blue sub-pixels and green sub-pixels are represented with a blank pattern. Similar to the first embodiment, after the electronic low color shift mode is turned on, it can be found from FIG. 6B and Table 5 below that in any column of red sub-pixel R (the first column C1, the fourth column C4, the seventh column C7 and the tenth column C10), the number of sub-pixels SP in the above four polarity and brightness groups is equal. Take table 5 as an example, within the range depicted in FIG. 6B, the numbers of the sub-pixels SP with high brightness and positive polarity H(+), low brightness and positive polarity L(+), high brightness and negative polarity H(−) and low brightness and negative polarity H (−) are all 1. Similarly, in other columns, blue sub-pixels and green sub-pixels are also distributed in this way. That is to say, under the arrangement of sub-pixels shown in FIG. 6B, after the electronic low color shift mode is turned on, the polarity distribution and bright-dark distribution among sub-pixels SP still show an average distribution, thus reducing the probability of display defects such as shake head.

TABLE 5

|  | H(+) | H(−) | L(+) | L(−) |
|---|---|---|---|---|
| C1 | 1 | 1 | 1 | 1 |
| C4 | 1 | 1 | 1 | 1 |
| C7 | 1 | 1 | 1 | 1 |
| C10 | 1 | 1 | 1 | 1 |

Figure 6C:
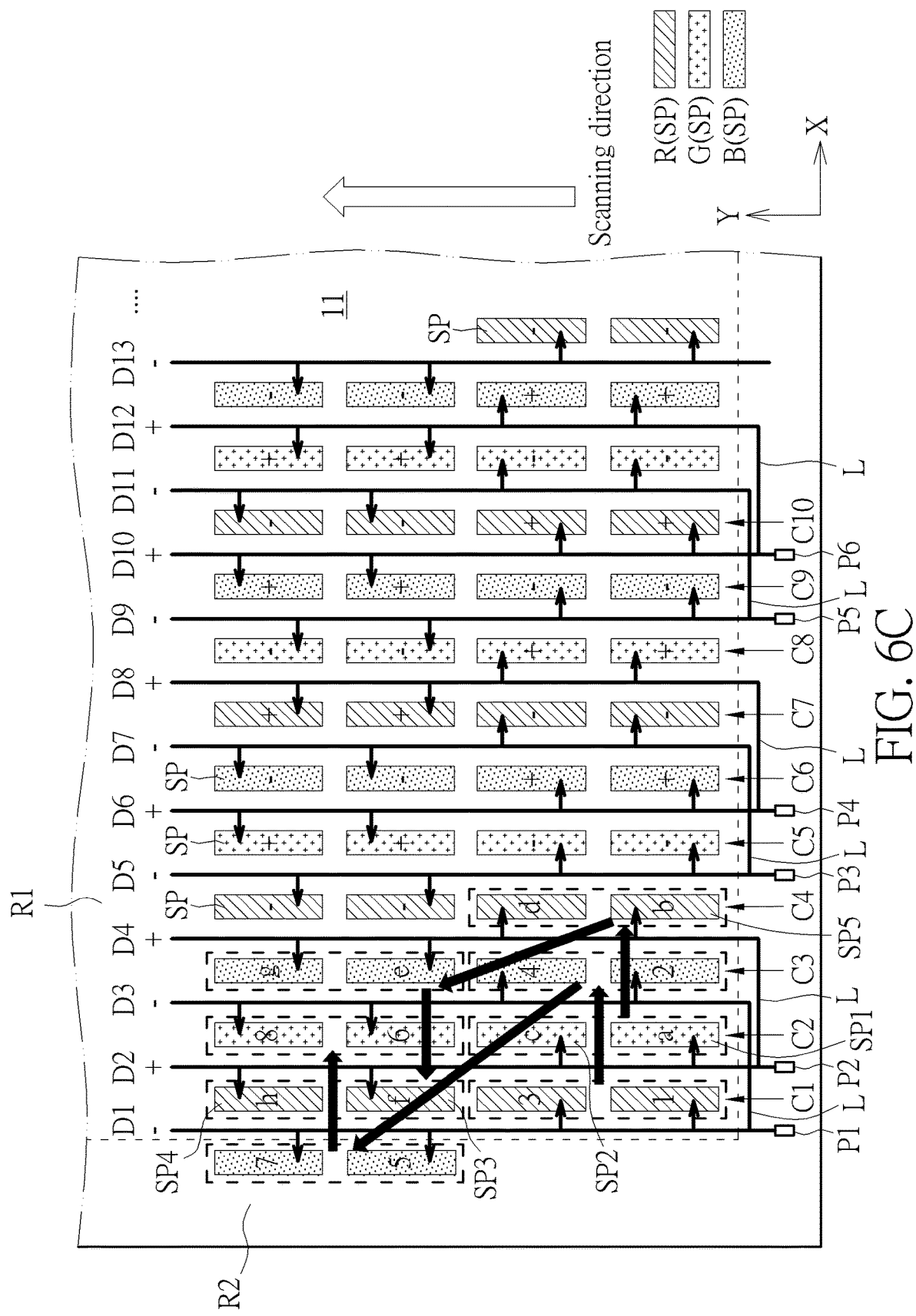

FIG. 6C is a partial top view of the display device according to the fifth embodiment of the present disclosure, which shows the signal update sequence of each sub-pixel after the dual line gate mode is turned on. The conditions for turning on the dual line gate mode are as described above and will not be repeated here. Similar to the above-mentioned first embodiment (FIG. 2C), in FIG. 6C, two adjacent sub-pixels SP with the same color are framed by dotted lines, and it can be found that the distribution positions of each sub-pixel SP in FIG. 6C are all adjacent, so the dual line gate mode can be turned on in FIG. 6C. In other words, the distribution and electrical connection of sub-pixels in the fifth embodiment of the present disclosure can also be applied to the dual line gate mode. Therefore, when the display screen needs to improve the update rate, the dual line gate mode can be properly turned on to improve the screen update rate. In addition, in FIG. 6C, the order of signal updating is indicated by a thick arrow (the sub-pixel SP enclosed by a dotted line is regarded as two sub-pixels that are charged at the same time, so the signal will be updated together). Taking the pad P2 as an example, two green sub-pixels G(a, c) in the second column C2 are updated first, then two red sub-pixels R(b, d) in the fourth column C4 are updated, then two blue sub-pixels B(e, g) in the third column C3 are updated, and finally two red sub-pixels R(f, h) in the first column C1 are updated.

Figure 7A:
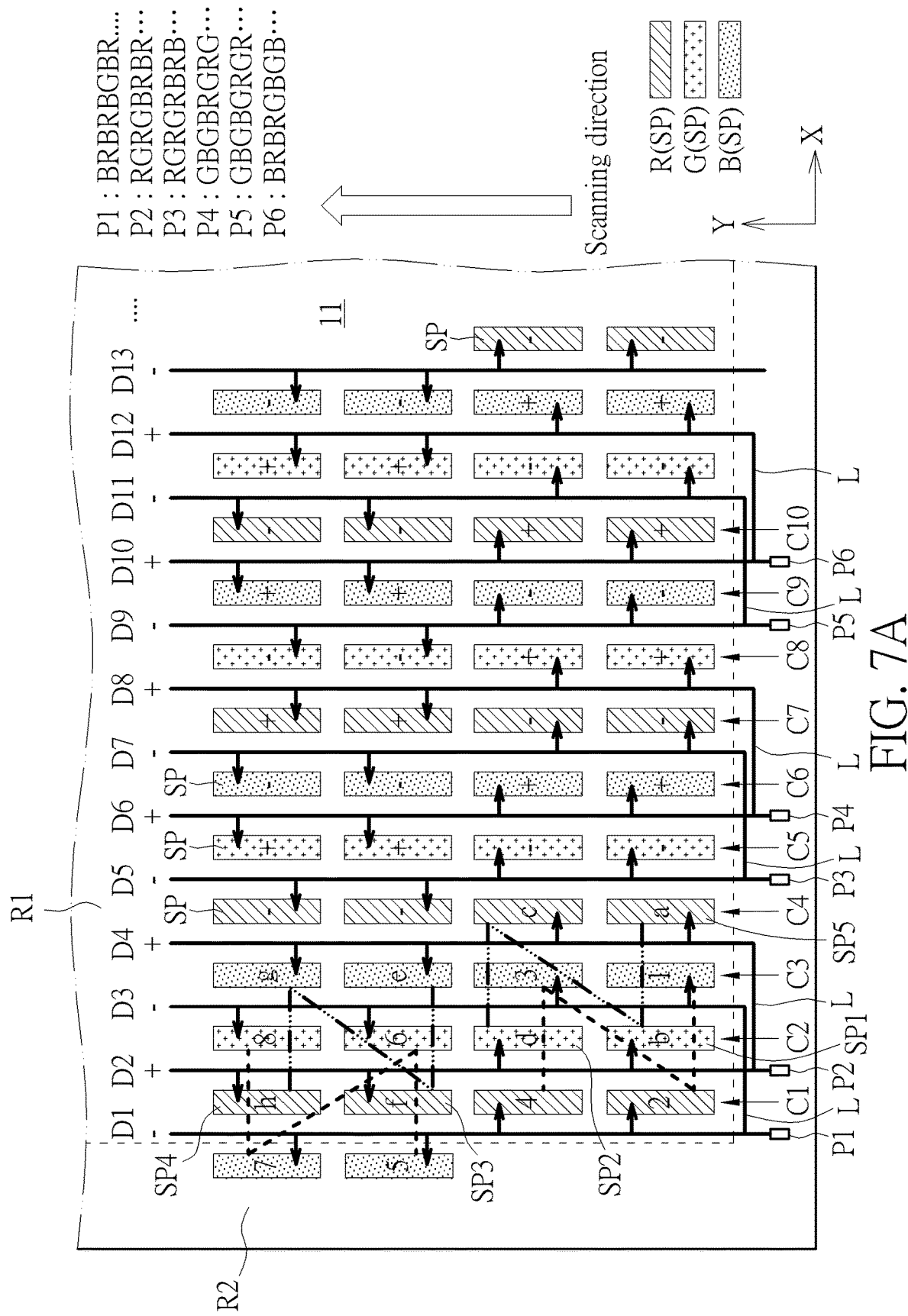
FIG. 7A shows a partial top view of a display device according to a sixth embodiment of the present disclosure, showing the signal update sequence of each sub-pixel.

FIG. 7A shows a partial top view of a display device according to a sixth embodiment of the present disclosure, showing the signal update sequence of each sub-pixel. As shown in FIG. 7A, most of the elements in this embodiment are the same as those in the above-mentioned fifth embodiment (the same as in FIG. 6A) and will not be repeated here. The main difference between this embodiment and the fifth embodiment is that the signal lines D1-D13 are slightly different in the way of electrically connecting the sub-pixels SP. For example, the signal line D1 and the signal line D3 are electrically connected with the pad P1 in the peripheral region R2 and then electrically connected with the line L, and the signal line D2 and the signal line D4 are electrically connected with the pad P2 in the peripheral region R2. In this way, only two signal output terminals are electrically connected with the pad P1 and the pad P2 to provide data signals for the four signal lines, which can save the usage of the signal driving integrated circuit and reduce the cost. Similarly, other signal lines are electrically connected in a similar way, as shown in FIG. 7A. Other regions not shown in FIG. 7A also include other pads connected to the signal lines in this arrangement.

Besides, as for the signal updating sequence of each sub-pixel, please refer to FIG. 7A. Take the pad P1 which is electrically connected to the signal line D1 and the signal line D3 as an example, the sequence of updating the signal of the sub-pixel SP from bottom to top is the blue sub-pixel (B,1) on the right side of the signal line D3 in the third column C3, the red sub-pixel (R,2) on the right side of the signal line D1 in the first column C1, the blue sub-pixel (B,3) on the right side of the signal line D3 in the third column C3, the red sub-pixel (R,4) on the right side of the signal line D1 in the first column C1, the blue sub-pixel (B, 5) on the left side of signal line D1 in the peripheral region R2, the green sub-pixel (G, 6) on the left side of signal line D3 in the second column C2, the blue sub-pixel (B, 7) on the left side of signal line D1 in the peripheral region R2, and the green sub-pixel (G, 7) on the left side of signal line D3 in the second column C2. It can be abbreviated as P1:BR-BRBGBG, reference can be made to the data mapping diagram on the right side of FIG. 7A, in which the sub-pixel signal update sequence of pads P1-P6 is drawn, while the signal update sequence of pad P7 is the same as that of pad P1 and begins to repeat the cycle, and so on for the subsequent electrical connection mode and signal update sequence.

In FIG. 7A, the order in which each sub-pixel SP is scanned is indicated by numbers, English letters and dashed lines. In FIG. 7A, numbers 1, 2, 3, 4 or numbers 5, 6, 7, 8 and English letters a, b, c, d or English letters e, f, g, h indicate the order in which sub-pixel SP signals of four adjacent sub-pixels are updated. Among them, some of the sub-pixel SP signal update sequences of four adjacent sub-pixels present a regular Z arrangement, while others present inverted Z arrangement. The structure shown in FIG. 7A (including the arrangement and electrical connection of sub-pixels) has similar advantages to the structure of the fifth embodiment (FIG. 6A). It can be observed from FIG. 7A that for any signal line D1-D13, some of the electrically connected sub-pixels SP are located on the left side of the signal line, while some of the electrically connected sub-pixels SP are located on the right side of the signal line. In addition, from the polarity (symbol "+" or symbol "−") of FIG. 7A, it can be found that for the same column (Y direction), there is no arrangement in which all sub-pixels SP have the same polarity. This can reduce the occurrence of vertical bright lines. In addition, in this embodiment, because signal lines are arranged between the sub-pixels SP in the same row, the distance between the sub-pixels SP in the same row is far enough, so this embodiment also reduces the problem that the display screen produces straight stripes when the sub-pixels are updated, and can improve the quality of the display screen.

Figure 7B:
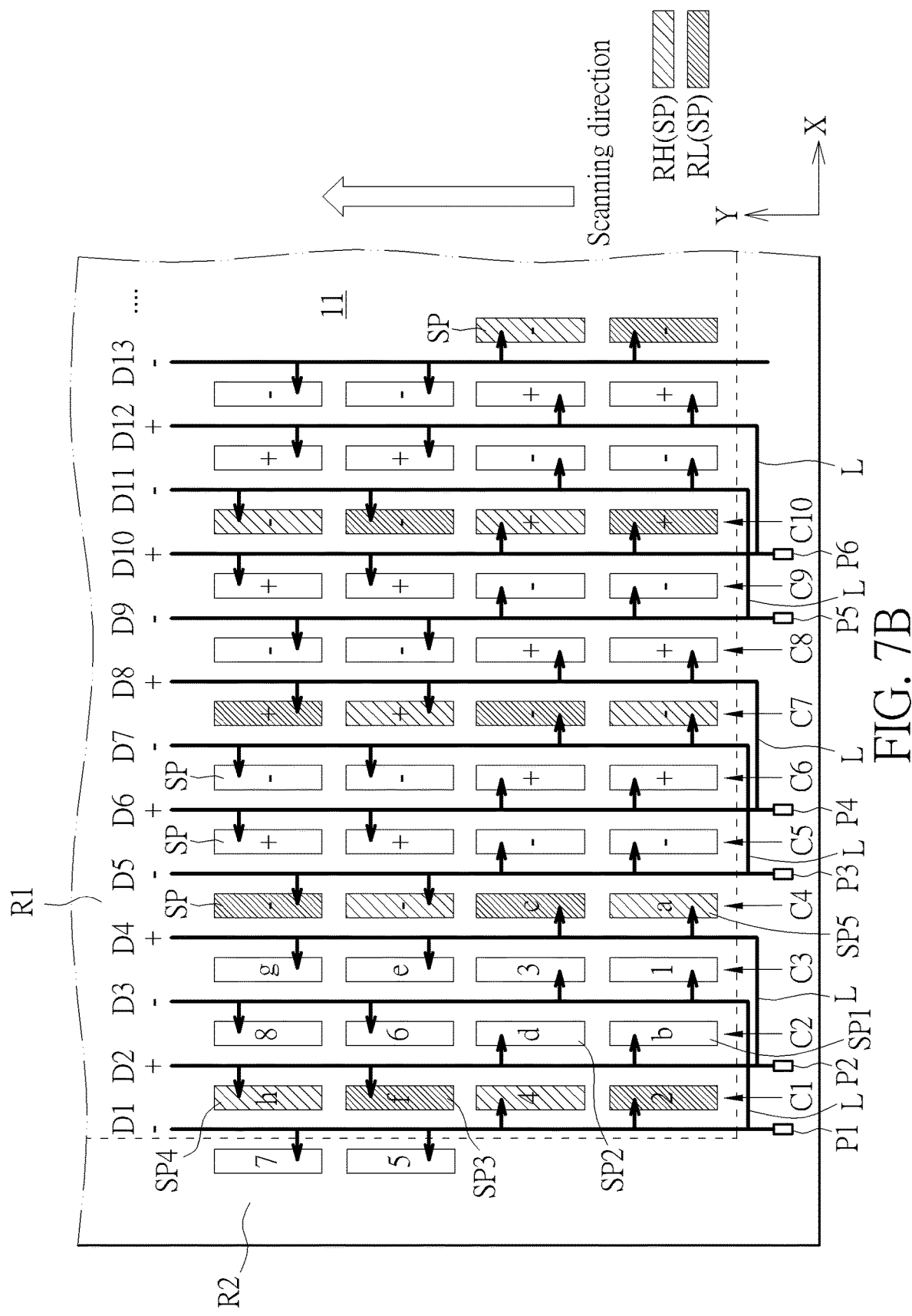

FIG. 7B shows a partial top view of the high and low voltage and positive and negative signals of the red sub-pixel after the electronic low color shift mode is turned on, according to the display device of the sixth embodiment of the present disclosure. In FIG. 7B, similarly to FIG. 6B of the aforementioned fifth embodiment, this embodiment only discusses the red sub-pixel R (refer to the position of the red sub-pixel R in FIG. 7A), and other blue sub-pixels and green sub-pixels are not discussed here. In order to clearly show the features on the figure, the blue sub-pixels and green sub-pixels are represented with a blank pattern. Similar to the above-mentioned fifth embodiment, after the electronic low color shift mode is turned on, it can be found from FIG. 7B and Table 6 below that in any column of red sub-pixel R (the first column C1, the fourth column C4, the seventh column C7 and the tenth column C10), the number of sub-pixels SP in the above four polarity and brightness groups is equal. Take table 6 as an example, within the range depicted in FIG. 7B, the numbers of the sub-pixels SP with high brightness and positive polarity H(+), low brightness and positive polarity L(+), high brightness and negative polarity H(−) and low brightness and negative polarity H (−) are all 1. Similarly, in other columns, blue sub-pixels and green sub-pixels are also distributed in this way. That is to say, under the arrangement of sub-pixels shown in FIG. 7B, after the electronic low color shift mode is turned on, the polarity distribution and bright-dark distribution among sub-pixels SP still show an average distribution, thus reducing the probability of display defects such as shake head.

TABLE 6

|  | H(+) | H(−) | L(+) | L(−) |
| --- | --- | --- | --- | --- |
| C1 | 1 | 1 | 1 | 1 |
| C4 | 1 | 1 | 1 | 1 |
| C7 | 1 | 1 | 1 | 1 |
| C10 | 1 | 1 | 1 | 1 |

Figure 7C:
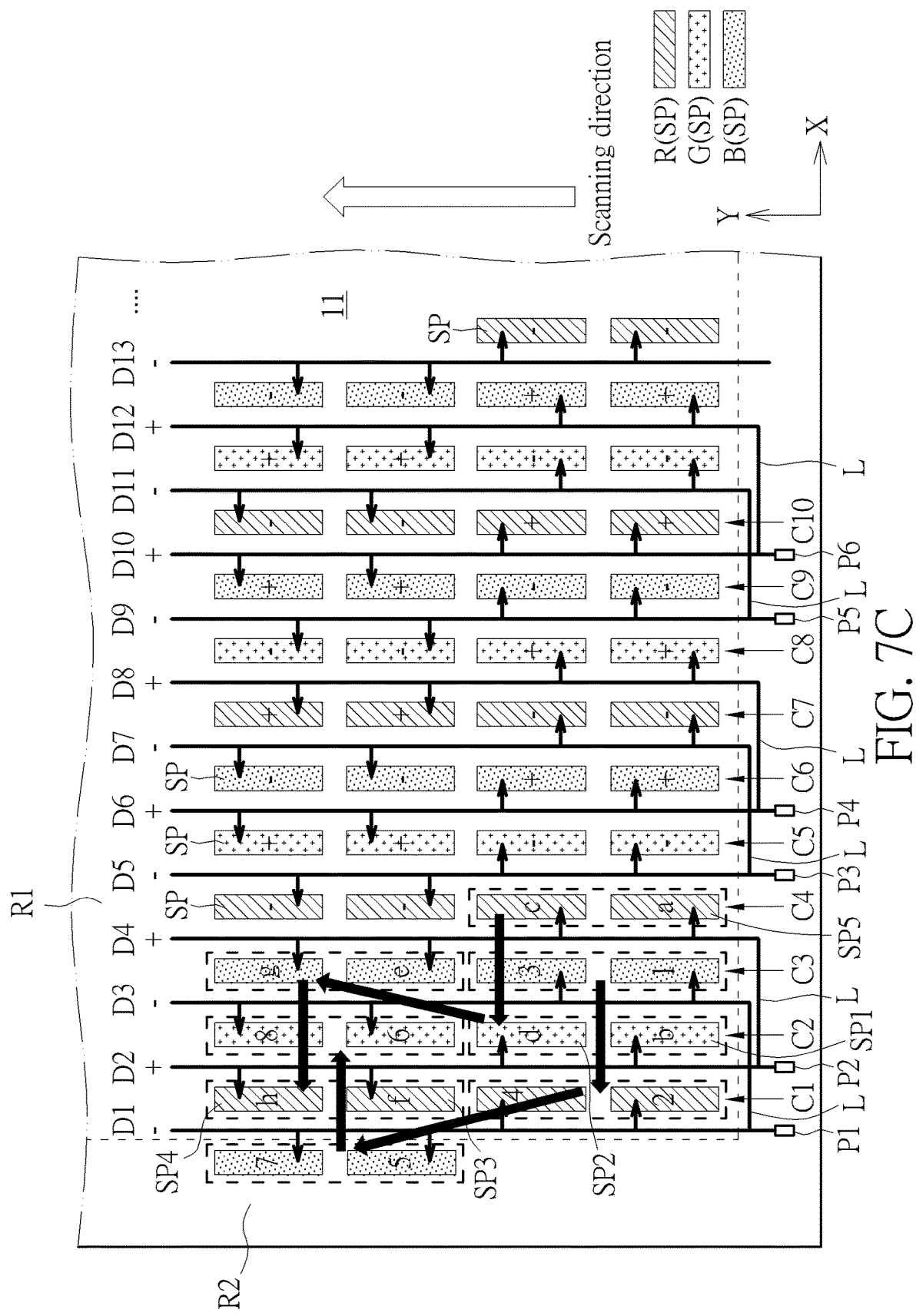

FIG. 7C shows a partial top view of the display device according to the sixth embodiment of the present disclosure, which shows the signal update sequence of each sub-pixel after the dual line gate mode is turned on. The conditions for turning on the dual line gate mode are as described above and will not be repeated here. Similarly to the fifth embodiment (FIG. 6C), in FIG. 7C, two adjacent sub-pixels SP with the same color are framed by dotted lines, and it can be found that the distribution positions of the sub-pixels SP in FIG. 7C are all adjacent, so the dual line gate mode can be turned on in FIG. 7C. In other words, the distribution and electrical connection of sub-pixels in the sixth embodiment of the present disclosure can also be applied to the dual line gate mode. Therefore, when the display screen needs to improve the update rate, the dual line gate mode can be properly turned on to improve the screen update rate. In addition, in FIG. 7C, the order of signal updating is indicated by thick arrows (the sub-pixel SP framed by dotted lines is regarded as two sub-pixels that are charged at the same time, so the signals will be updated together). Taking the pad P2 as an example, two red sub-pixels R(a, c) in the fourth column C4 are updated first, then two green sub-pixels G(B, d) in the second column C2 are updated, then two blue sub-pixels B(e, g) in the third column C3, and finally two red sub-pixels R(f, h) in the first column C1 are updated.

Based on the above description and drawings, the present disclosure proposes an electronic device (the structure shown in FIGS. 2A-7C in various embodiments), which includes a substrate 11, a first signal line (the signal line D2 in the first, second, third and fourth embodiments, and the signal line D2 on the left side of the second column C2 in the display region R1 in the fifth and sixth embodiments), and the first signal line D2 is arranged on the substrate 11 along the first direction (Y direction). A first electrode in a first sub-pixel SP1 (an electrode included in the sub-pixel SP1 labeled in each embodiment) and a second electrode in a second sub-pixel SP2 (an electrode included in the sub-pixel SP2 labeled in each embodiment), which are arranged on a substrate 11 and arranged along a first direction, and a third electrode in the third sub-pixel SP3 (an electrode included in the sub-pixel SP3 labeled in each embodiment) and a fourth electrode in the fourth sub-pixel SP4 (an electrode included in the sub-pixel SP4 labeled in each embodiment), which are arranged on the substrate 11 and arranged along the first direction. The first electrode in the first sub-pixel SP1, the second electrode in the second sub-pixel SP2, the third electrode in the third sub-pixel SP3 and the fourth electrode in the fourth sub-pixel SP4 are electrically connected with the first signal line D2, and the first electrode in the first sub-pixel SP1 and the second electrode in the second sub-pixel SP2 are located on the first side (e.g. left or right) of the first signal line D2, and the third electrode in the third sub-pixel SP3 and the fourth electrode in the fourth sub-pixel SP4 are located on the second side (e.g. right or left) of the first signal line D2 relative to the first side (for example, when the first side is left side and the second side is right side; or when the first side is the right side and the second side is the left side).

In some embodiments of the present disclosure, a fifth electrode in the fifth sub-pixel SP5 (the electrode included in the sub-pixel SP5 labeled in each embodiment) is further included. The fifth electrode in the fifth sub-pixel SP5 is disposed on the substrate 11 and electrically connected to the first signal line D2, wherein the first electrode in the first sub-pixel SP1 and the fifth electrode in the fifth sub-pixel SP5 are arranged along a second direction (for example, the X direction) perpendicular to the first direction.

In some embodiments of the present disclosure, the first electrode in the first sub-pixel SP1, the second electrode in the second sub-pixel SP2, the third electrode in the third sub-pixel SP3, the fourth electrode in the fourth sub-pixel SP4 and the fifth electrode in the fifth sub-pixel SP5 are electrically connect the same signal line.

In some embodiments of the present disclosure, a first signal is transmitted to the first electrode in the first sub-pixel SP1 through the first signal line D2, a second signal is transmitted to the fifth electrode in the fifth sub-pixel SP5 through the first signal line D2, and a third signal is transmitted to the second electrode in the second sub-pixel SP2 through the first signal line D2, wherein the transmission time of the second signal is later than that of the first signal, and the transmission time of the third signal is later than that of the second signal (refer to the data mapping diagram of each embodiment).

In some embodiments of the present disclosure, the fifth electrode in the fifth sub-pixel SP5 is disposed between the first signal line D2 and the first electrode in the first sub-pixel SP1 (as in the embodiment shown in FIG. 2A).

In some embodiments of the present disclosure, the first electrode in the first sub-pixel SP1 is disposed between the first signal line D2 and the fifth electrode in the fifth sub-pixel SP5 (as in the embodiment shown in FIG. 3A).

In some embodiments of the present disclosure, a second signal line (the signal line D4 located on the left side of the fourth column C4 in the display region R1 in the fifth and sixth embodiments) is further included, and the second signal line D4 is disposed on the substrate 11 and extends along the first direction (Y direction).

In some embodiments of the present disclosure, a connection line L is further included, which electrically connects the first signal line (the signal line D2 located on the left side of the second column C2 in the display region R1 in the fifth and sixth embodiments) and the second signal line (the signal line D4 located on the left side of the fourth column C4 in the display region R1 in the fifth and sixth embodiments).

In some embodiments of the present disclosure, the connection line L is disposed in the peripheral region R2 of the substrate 11.

In some embodiments of the present disclosure, a fifth electrode in the fifth sub-pixel SP5 is further included, and the fifth electrode in the fifth sub-pixel SP5 is disposed on the substrate 11 and electrically connected to the second signal line D4.

In some embodiments of the present disclosure, a first signal is transmitted to the first electrode in the first sub-pixel SP1 through the first signal line (the signal line D2 located on the left side of the second column C2 in the display region R1 in the fifth and sixth embodiments), and a second signal is transmitted to the fifth electrode in the fifth sub-pixel SP5 through the second signal line (the signal line D4 located on the left side of the fourth column C4 in the display region R1 in the fifth and sixth embodiments), a third signal is transmitted to the second electrode in the second sub-pixel SP2 through the first signal line (the signal line D2 located on the left side of the second column C2 in the display region R1 in the fifth and sixth embodiments), wherein the transmission time of the second signal is later than that of the first signal, and the transmission time of the third signal is later than that of the second signal (refer to the data mapping diagram of each embodiment).

In some embodiments of the present disclosure, the first signal line (the signal line D2 located on the left side of the second column C2 in the display region R1 in the fifth and sixth embodiments) and the second signal line (the signal line D4 located on the left side of the fourth column C4 in the display region R1 in the fifth and sixth embodiments) transmit the same signal.

In some embodiments of the present disclosure, the first electrode and the second electrode have the same luminescent color, and the third electrode and the fourth electrode have the same luminescent color.

In some embodiments of the present disclosure, the first electrode and the second electrode are adjacent in a first direction (Y direction).

In some embodiments of the present disclosure, the third electrode and the fourth electrode (Y direction) are adjacent in the first direction.

The present disclosure proposes a display panel (the structure shown in FIGS. 2A-7C in various embodiments), which includes a substrate 11, a first signal line (the signal line D2 in the first, second, third and fourth embodiments, and the signal line D2 on the left side of the second column C2 in the display region R1 in the fifth and sixth embodiments), and the first signal line D2 is arranged on the substrate 11 along the first direction (Y direction). A first electrode in a first sub-pixel SP1 (an electrode included in the sub-pixel SP1 labeled in each embodiment) and a second electrode in a second sub-pixel SP2 (an electrode included in the sub-pixel SP2 labeled in each embodiment), which are arranged on a substrate 11 and arranged along a first direction, and a third electrode in the third sub-pixel SP3 (an electrode included in the sub-pixel SP3 labeled in each embodiment) and a fourth electrode in the fourth sub-pixel SP4 (an electrode included in the sub-pixel SP4 labeled in each embodiment), which are arranged on the substrate 11 and arranged along the first direction. The first electrode in the first sub-pixel SP1, the second electrode in the second sub-pixel SP2, the third electrode in the third sub-pixel SP3 and the fourth electrode in the fourth sub-pixel SP4 are electrically connected with the first signal line D2, and the first electrode in the first sub-pixel SP1 and the second electrode in the second sub-pixel SP2 are located on the first side (e.g. left or right) of the first signal line D2, and the third electrode in the third sub-pixel SP3 and the fourth electrode in the fourth sub-pixel SP4 are located on the second side (e.g. right or left) of the first signal line D2 relative to the first side (for example, when the first side is left side and the second side is right side; or when the first side is the right side and the second side is the left side).

The feature of the present disclosure is to provide an electronic device or a display panel, such as an electronic device with a display function and a display region. A plurality of sub-pixels are arranged in the display region, and the electrodes in the sub-pixels are electrically connected with the signal lines and the scanning lines. By designing the arrangement of the sub-pixels and the electrical connection of the electrodes in the sub-pixels with the signal lines and the scanning lines, the polarity and brightness of each sub-pixel are evenly distributed in the signal updating process of the display device, so that the possibility that users feel vertical bright lines and shake lines when watching a picture can be reduced, and the quality of products can be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a substrate;
   a first signal line arranged on the substrate and extending along a first direction;
   a first electrode and a second electrode, which are arranged on the substrate and arranged along the first direction; and
   a third electrode and a fourth electrode, which are arranged on the substrate and arranged along the first direction;
   wherein the first electrode, the second electrode, the third electrode and the fourth electrode are electrically connected with the first signal line, and the first electrode and the second electrode are located on a first side of the first signal line, and the third electrode and the fourth electrode are located on a second side of the first signal line relative to the first side;
   a fifth electrode disposed on the substrate and electrically connected to the first signal line, wherein the first electrode and the fifth electrode are arranged along a second direction perpendicular to the first direction, wherein a first signal is transmitted to the first electrode through the first signal line, a second signal is transmitted to the fifth electrode through the first signal line, and a third signal is transmitted to the second electrode through the first signal line, wherein the transmission time of the second signal is later than that of the first signal, and the transmission time of the third signal is later than that of the second signal.

2. The electronic device according to claim 1, wherein the fifth electrode is arranged between the first signal line and the first electrode in a plan view direction of the electronic device.

3. The electronic device according to claim 1, wherein the first electrode is arranged between the first signal line and the fifth electrode in a plan view direction of the electronic device.

4. The electronic device according to claim 1, further comprising a second signal line disposed on the substrate and extending along the first direction.

5. The electronic device as claimed in claim 4, further comprising a connection line electrically connecting the first signal line and the second signal line.

6. The electronic device according to claim 5, wherein the connection line is arranged in a peripheral region of the substrate.

7. The electronic device according to claim 4, further comprising a fifth electrode disposed on the substrate and electrically connected to the second signal line.

8. The electronic device according to claim 7, wherein a first signal is transmitted to the first electrode through the first signal line, a second signal is transmitted to the fifth electrode through the second signal line, and a third signal is transmitted to the second electrode through the first signal line, wherein the transmission time of the second signal is later than that of the first signal, and the transmission time of the third signal is later than that of the second signal.

9. The electronic device according to claim 4, wherein the first signal line and the second signal line transmit the same signal.

10. The electronic device according to claim 1, wherein the first electrode and the second electrode have the same luminescent color, and the third electrode and the fourth electrode have the same luminescent color.

11. The electronic device according to claim 1, wherein the first electrode and the second electrode are adjacent in the first direction.

12. The electronic device according to claim 1, wherein the third electrode and the fourth electrode are adjacent in the first direction.

13. A display panel, comprising:
   a substrate;
   a first signal line arranged on the substrate and extending along a first direction;
   a first electrode and a second electrode, which are arranged on the substrate and arranged along the first direction; and
   a third electrode and a fourth electrode, which are arranged on the substrate and arranged along the first direction;
   wherein the first electrode, the second electrode, the third electrode and the fourth electrode are electrically connected with the first signal line, and the first electrode and the second electrode are located on a first side of the first signal line, and the third electrode and the fourth electrode are located on a second side of the first signal line relative to the first side;
   a fifth electrode disposed on the substrate and electrically connected to the first signal line, wherein the first electrode and the fifth electrode are arranged along a second direction perpendicular to the first direction, wherein a first signal is transmitted to the first electrode through the first signal line, a second signal is transmitted to the fifth electrode through the first signal line, and a third signal is transmitted to the second electrode through the first signal line, wherein the transmission time of the second signal is later than that of the first signal, and the transmission time of the third signal is later than that of the second signal.

14. The display panel according to claim 13, wherein the fifth electrode is arranged between the first signal line and the first electrode in a plan view direction of the electronic device.

15. The display panel according to claim 13, wherein the first electrode is arranged between the first signal line and the fifth electrode in a plan view direction of the electronic device.

16. The display panel according to claim 13, further comprising a second signal line disposed on the substrate and extending along the first direction.

* * * * *